(12) United States Patent
Kim et al.

(10) Patent No.: US 12,731,622 B2
(45) Date of Patent: Sep. 8, 2026

(54) MEMORY CONTROLLER COMMUNICATING WITH VERTICALLY STACKED DIES AND SEMICONDUCTOR DEVICE INCLUDING THE SAME

(71) Applicant: SAMSUNG ELECTRONICS CO., LTD., Suwon-si (KR)

(72) Inventors: Geonho Kim, Suwon-si (KR); Kyeongkeun Kang, Suwon-si (KR); Shinyoung Yi, Suwon-si (KR); Kwanyeob Chae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 18/955,618

(22) Filed: Nov. 21, 2024

(65) Prior Publication Data

US 2025/0266067 A1 Aug. 21, 2025

(30) Foreign Application Priority Data

Feb. 21, 2024 (KR) ........................ 10-2024-0025308
Apr. 11, 2024 (KR) ........................ 10-2024-0048855

(51) Int. Cl.

| | |
|---|---|
| ***G11C 16/04*** | (2006.01) |
| ***G11C 7/10*** | (2006.01) |
| ***G11C 7/22*** | (2006.01) |
| ***H03L 7/081*** | (2006.01) |

(52) U.S. Cl.

CPC ............ *G11C 7/1066* (2013.01); *G11C 7/222* (2013.01); *H03L 7/0814* (2013.01)

(58) Field of Classification Search

CPC ...... G11C 7/1066; G11C 7/222; H03L 7/0814
See application file for complete search history.

(56) References Cited

U.S. PATENT DOCUMENTS

| | | | |
|---|---|---|---|
| 7,567,106 | B2 | 7/2009 | Park et al. |
| 8,024,598 | B2 | 9/2011 | Kim et al. |
| 8,400,196 | B2 | 3/2013 | Kim |
| 11,703,905 | B1 | 7/2023 | Qin et al. |
| 2021/0390991 | A1 | 12/2021 | Kumar et al. |
| 2023/0035176 | A1 | 2/2023 | Jeong et al. |

(Continued)

FOREIGN PATENT DOCUMENTS

| | | |
|---|---|---|
| CN | 110299911 | 10/2019 |
| KR | 10-0712537 | 4/2007 |

*Primary Examiner* — Pho M Luu
(74) *Attorney, Agent, or Firm* — Fish & Richardson P.C.

(57) ABSTRACT

A semiconductor device includes at least one core die including a memory cell array, and a logic die configured to communicate with the at least one core die, the logic die includes first through fourth TSV circuit blocks including circuits each arranged in response to at least one TSV and configured to generate first through fourth output signals having different phases from each other, in which the first TSV circuit block generates the first output signal in synchronization with a first clock signal, the second TSV circuit block generates the second output signal in synchronization with a second clock signal, the third TSV circuit block generates the third output signal in synchronization with a clock signal obtained by inverting the first clock signal, and the fourth TSV circuit block generates the fourth output signal in synchronization with a clock signal obtained by inverting the second clock signal.

20 Claims, 21 Drawing Sheets

(56) References Cited

U.S. PATENT DOCUMENTS

| | | | | |
|---|---|---|---|---|
| 2023/0070785 | A1* | 3/2023 | Lee | H10P 74/207 |
| 2023/0360694 | A1 | 11/2023 | Best et al. | |
| 2024/0421040 | A1* | 12/2024 | Narui | H10W 20/20 |
| 2026/0082998 | A1* | 3/2026 | Kuo | H10W 20/20 |

* cited by examiner

MEMORY CONTROLLER COMMUNICATING WITH VERTICALLY STACKED DIES AND SEMICONDUCTOR DEVICE INCLUDING THE SAME

CROSS-REFERENCE TO RELATED APPLICATIONS

This application claims priority to Korean Patent Application No. 10-2024-0025308, filed on Feb. 21, 2024, and Korean Patent Application No.10-2024-0048855, filed on Apr. 11, 2024, in the Korean Intellectual Property office, the disclosures of which are incorporated by reference herein in their entirety.

BACKGROUND

As an example of semiconductor devices, dynamic random access memory (DRAM) is a volatile memory which determines data by using a charge stored in a capacitor. As an example of DRAM, a high-bandwidth memory (HBM) providing multi-channel interface input/output is employed in various systems, such as graphics, servers, supercomputers, and networks, which require high performance and low power, and the HBM may have a structure in which a buffer die (or base die) communicating with an external host and one or more core dies (or memory dies) including a memory cell array are stacked.

In general, the HBM may be mounted separately from the external host on an interposer, and high-speed communication according to a certain interface may be performed between the external host and the HBM. However, due to high-speed communication via the interposer, latency in the signal transmission and reception may increase significantly, and in addition, an increase in power consumption due to high-speed communication may occur.

SUMMARY

In general, in some aspects, the present disclosure id directed toward a memory controller capable of reducing an increase in latency or power consumption due to high-speed communication with the outside by using a die, including a memory controller, which performs communication via dies including memory cell arrays vertically stacked thereon and via through silicon vias (TSVs).

According to some aspects, the present disclosure is directed to a semiconductor device that includes at least one core die including a memory cell array, and a logic die configured to communicate with the at least one core die via a plurality of TSVs, wherein the logic die includes a memory controller configured to control a memory operation on the at least one core die, first through fourth TSV circuit blocks including circuits each arranged in response to at least one TSV, configured to receive first through fourth input signals, and generate first through fourth output signals having different phases from each other and transmitted to the at least one core die via the TSVs, and a multi-phase clock generator configured to generate a first clock signal and a second clock signal having different phases from each other, provide the first clock signal to the first and third TSV circuit blocks, and provide the second clock signal to the second and fourth TSV circuit blocks, wherein the first TSV circuit block generates the first output signal in synchronization with the first clock signal, the second TSV circuit block generates the second output signal in synchronization with the second clock signal, the third TSV circuit block generates the third output signal in synchronization with a clock signal w obtained by inverting the first clock signal, and the fourth TSV circuit block generates the fourth output signal in synchronization with a clock signal obtained by inverting the second clock signal.

According to some implementations, the present disclosure is directed to a semiconductor device that includes at least one first die including a memory cell array, and a second die configured to communicate with the first die via a plurality of TSVs, wherein the second die includes a memory controller configured to control a memory operation on the first die, and a physical layer (PHY) region configured to receive from the memory controller, as an input signal, a command/address including a plurality of bits in relation with a control of the memory operation, generate bits of the command/address having M phases based on first through $K^{th}$ clock signals having different phases from each other as an output signal, and transmit the output signal to the first die via the TSVs (K is an integer of 2 or more, and M is an integer greater than K).

According to some implementations, the present disclosure is directed to a memory controller that includes a memory control unit configured to control a memory operation on a memory device, and a PHY region configured to communicate with the memory device via a plurality of TSVs, wherein the PHY includes a multi-phase clock generator configured to generate a first clock signal and a second clock signal having different phases from each other, and first through $M^{th}$ TSV circuit blocks configured to receive first through $M^{th}$ input signals from the memory control unit, and output, to the TSVs, first through $M^{th}$ output signals having different phases from each other by processing the first through $M^{th}$ input signals based on the first and second clock signals (M is an integer of 3 or more), wherein the phases of the first through $M^{th}$ output signals includes phases corresponding to the first and second clock signals and phases of clock signals obtained by inverting the first and second clock signals.

BRIEF DESCRIPTION OF THE DRAWINGS

Example implementations will be more clearly understood from the following detailed description, taken in conjunction with the accompanying drawings.

DETAILED DESCRIPTION

Hereinafter, example implementations will be described in detail with reference to the accompanying drawings.

Figure 1:
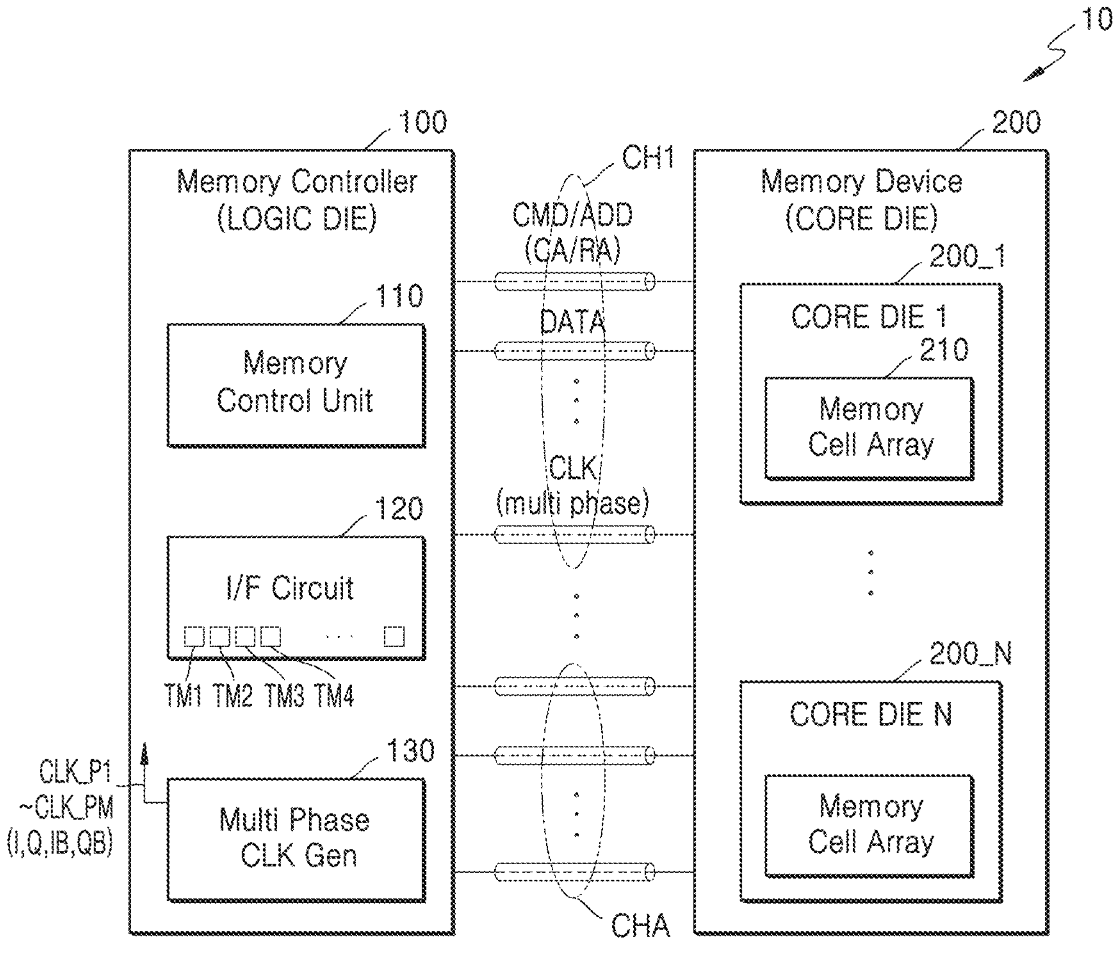
FIG. 1 is a block diagram of examples of a memory controller and a semiconductor device including the memory controller according to some implementations.

FIG. 1 is a block diagram of examples of a memory controller and a semiconductor device including the memory controller according to some implementations. In FIG. 1, a semiconductor device 10 may include the memory controller and a memory device 200. The memory controller may be variously implemented as a semiconductor chip level, a semiconductor die, or the like, and may be referred to as a logic die 100 from an aspect that the memory controller performs a logic operation controlling a memory operation on the memory device 200. In some implementations, the logic die 100 may include a memory control unit 110, an interface (I/F) circuit 120, and a multi-phase clock generator 130.

The memory device 200 may include one or more semiconductor chips or semiconductor dies having a stacked structure, and in some implementations, the memory device 200 may be described to include a multiple core dies each including a memory cell array. The core die described above may also be referred to as a memory die from an aspect of including the memory cell array. In addition, because the semiconductor device 10 includes the memory controller and the memory device 200, the semiconductor device 10 may correspond to a memory system. The memory system may be implemented to be included in a personal computer (PC), a mobile electronic device, or a data server.

In FIG. 1, the memory device 200 may include first through Nth core dies 200_1 through 200_N, the first core die 200_1 may include a memory cell array 210, and the memory cell array 210 may include a plurality of dynamic random access memory (DRAM) cells. However, the present disclosure not limited thereto, and the memory cell array 210 may also include various types of memory cells, such as resistive RAM (RRAM) cells, ferro-electric RAM (FRAM) cells, phase change RAM (PRAM) cells, thyristor RAM (TRAM) cells, magnetoresistive RAM (MRAM) cells, flash memory cells, etc. In addition, in some implementations, each of the first through $N^{th}$ core dies 200_1 through 200_N may also further include various periphery circuits for controlling write and read operations of the memory cells.

The logic die 100 may control a memory operation on the memory device 200 based on a request from an external host (not illustrated). For example, the logic die 100 may communicate with an external host based on various interface protocols, such as peripheral component interconnect-express (PCI-E), advanced technology attachment (ATA), serial ATA (SATA), parallel ATA (PATA), and serial attached small computer serial interface (SCSI) (SAS), and may provide an access result of the memory device 200 to the external host.

In some implementations, the logic die 100 may generate a request to the memory device 200 as its function as a host is performed, and the memory control unit 110 may control a memory operation on the memory device 200 in response to the request. As an example, the logic die 100 may include or correspond to an application specific integrated circuit (ASIC), a system on chip (SoC), an application processor (AP), a mobile AP, a chipset, etc. In addition, the logic die 100 may further include at least one of various components which function as a host, such as a central processing unit (CPU), a graphics processing unit (GPU), a neural processing unit (NPU), an accelerated processing unit (APU), and a tensor processing unit (TPU).

Based on the control of the memory control unit 110, the logic die 100 may provide a command/address CMD/ADD, data DATA, and a clock signal CLK to the memory device 200 via the I/F circuit 120. For example, the command/address CMD/ADD may include a column address CA and a row address RA, and may provide write data to the memory device 200 or receive read data from the memory device 200.

In some implementations, the semiconductor device 10 may correspond to a high bandwidth memory HBM. In FIG. 1, for convenience of illustration, the logic die 100 and the first through $N^{th}$ core dies 200_1 through 200_N are separately illustrated at different positions on the same plane, but the first through $N^{th}$ core dies 200_1 through 200_N may be vertically stacked on the logic die 100 in a three dimensional (3D) form, and the logic die 100 and the first through $N^{th}$ core dies 200_1 through 200_N may communicate with each other via through silicon vias TSV and/or through backside vias TBVs. In addition, each of the first through $N^{th}$ core dies 200_1 through 200_N may include a plurality of channels that communicate with the logic die 100 independently of each other, and the through silicon via TSV and/or the through backside via TBV may be physically separated from each other for the plurality of channels. In FIG. 1, when the memory device 200 may include first through $A^{th}$ channels CHI through CHA, and when each core die includes two channels, A channels may correspond to 2*N channels. In addition, when each core die includes four channels, the A channels may correspond to 4*N channels. In some implementations, it is assumed that the logic die 100 and the first through $N^{th}$ core dies 200_1 through 200_N communicate with each other via the through silicon via TSV.

An example of an operation of the semiconductor device 10 is described below. In describing an operation example in some implementations, a case, in which the command/address CMD/ADD, the data DATA, and the clock signal CLK are transceived between the logic die 100 and the first channel CH1 of the first core die 200_1, is described, but other various types of signals in addition to the signals described above may be further transceived.

As the semiconductor device 10 is implemented in the form of the high bandwidth memory HBM, the logic die 100 may transmit various signals to the first core die 200_1 via the through silicon via TSV. In this case, because a plurality of core dies are directly stacked on the logic die 100 performing a memory control function, a buffer die arranged under the existing high bandwidth memory HBM and communicating with an external logic chip (or an external host) may not be provided in the semiconductor device 10 in the present disclosure. In addition, because the logic die 100 directly communicates with the core dies, a TSV physical (or, physical layer) (PHY) region TSV PHY, which is included in a buffer die of an existing high bandwidth memory HBM and performs communication via the through silicon via TSV may be included in the logic die 100 according to the embodiment.

In other words, the logic die 100 may transmit various signals to the first core die 200_1 via the through silicon via TSV based on a relatively low speed, without performing a high-speed interface with the first core die 200_1 according to the Joint Electron Device Engineering Council (JEDEC) standard specification or without performing a converting function for the JEDEC standard specification, and thus, in this manner, the logic die 100 may improve signal transmission and reception characteristics and reduce power consumption.

In some implementations, the logic die 100 may transmit various signals to the first core die 200_1 at a relatively low speed based on a multi-phase method. The multi-phase clock generator 130 may generate multi-phase clock signals (CLK_P1 through CLK_PM) having a plurality of (for example, M) different phases based on a reference clock signal having an arbitrary frequency, and as an example, may generate four phase clock signals having a phase difference of approximately 90 degrees from each other. The logic die 100 may transmit the multi-phase clock signals (CLK_P1 through CLK_PM) to the first core die 200_1 through a plurality of through silicon vias TSV.

In addition, the logic die 100 may generate various signals having multi phase by using at least some of the multi-phase clock signals (CLK_P1 through CLK_PM). As an example of the command/address CMD/ADD, the logic die 100 may transmit bits of the command/address CMD/ADD having multi-phase to the first core die 200_1 via through silicon vias TSV. In an operation example, as the first core die 200_1 receives the command/address CMD/ADD and the data DATA in synchronization with the multi-phase clock signals (CLK_P1 through CLK_PM) having relatively low frequencies, an effective window margin of signal reception may be improved and stable communication may be performed.

The interface circuit 120 may include a physical region (for example, the TSV PHY region) for communication with the first through $N^{th}$ core dies 200_1 through 200_N. The TSV PHY region may include a TSV array region, and the TSV array region may include a plurality of through silicon vias TSV arranged in an array form.

A unit including one or more circuits related to processing of signals transceived via the through silicon via TSV may be defined as a TSV macro. However, in some implementations, components may be defined in various terms, and the TSV macro may be defined as a TSV circuit block, or a TSV slice, or other various terms. In addition, each TSV macro may be defined as a concept that includes circuits arranged in correspondence to one through silicon via TSV, or may also be defined as a concept that includes circuits arranged in correspondence to two or more through silicon vias TSV. In some implementations, the TSV macro may also be defined only in response to some of the entire through silicon vias TSV provided in the logic die 100. In addition, the range of circuits included in the TSV macro described above may be variously defined, and for example, the TSV macro may be defined as including a corresponding through silicon via TSV, or the TSV macro may also be defined as including circuits which are related to the through silicon via TSV but do not directly include the through silicon via TSV.

The I/F circuit 120 may include a plurality of TSV macros related to communication with a plurality of channels of the first through $N^{th}$ core dies 200_1 through 200_N, and some of the plurality of TSV macros may transmit signals based on the multi-phase described above. In this case, in relation to generation of signals having multi-phase, at least some clock signals among the multi-phase clock signals (CLK_P1 through CLK_PM) from the multi-phase clock generator 130 may be provided to the TSV macros.

In some implementations, the I/F circuit 120 may use fewer clock signals than the number of multi-phases, in generating signals having multi-phase. For example, assuming that the logic die 100 transmits signals having four different phases to the first core die 200_1 and the multi-phase clock generator 130 sequentially generates first through fourth clock signals (I, Q, IB, and QB), that sequentially have a phase difference of approximately 90 degrees, only some clock signals (for example, the first and second clock signal signals I and Q) among the first through fourth clock signals (I, Q, IB, and QB) may be provided to the TSV macros of the I/F circuit 120.

Assuming that first through fourth TSV macros TM1 through TM4 among the TSV macros included in the I/F circuit 120 output the command/address CMD/ADD sequentially having a phase difference of approximately 90 degrees, the first clock signal I may be provided to the first and third TSV macros TM1 and TM3, and the second clock signal Q may be provided to the second and fourth macros TM2 and TM4. In some implementations, assuming that the first clock signal I has a phase of approximately 0 degrees, the first TSV macro TM1 may output the command/address CMD/ADD having a phase of approximately 0 degrees in synchronization with the first clock signal I, and the second TSV macro TM2 may output the command/address CMD/ADD having a phase of approximately 90 degrees in synchronization with the second clock signal Q. In addition, the third TSV macro TM3 may output the command/address CMD/ADD having a phase of approximately 180 degrees in synchronization with an inverted clock signal of the first clock signal I, and the fourth TSV macro TM4 may output the command/address CMD/ADD having a phase of approximately 270 degrees in synchronization with the inverted clock signal of the second clock signal Q.

In some implementations, the multi-phase clock signal may also be transmitted to the first through $N^{th}$ core dies 200_1 through 200_N based on the signal processing of the TSV macros described above. As an example, a reference clock (or system clock) may be provided as an input to multiple TSV macros in common, some of the multiple-phase clock signals generated by the multi-phase clock generator 130 may be provided to multiple TSV macros, and multi-phase clock signals with different phases may be transmitted via the through silicon vias TSV based on phase synchronization processing according to the method described above. In addition, various signals may have multi-phase and be transmitted to the first through $N^{th}$ core dies 200_1 through 200_N according to the method described above, for example, bits of data may be provided to TSV macros as input signals, bits of data with multi-phase may be generated based on the phase synchronization processing described above, and bits of data with multi-phase may be transmitted via the through silicon vias TSV.

According to some implementations, because various signals from the logic die 100 is transmitted to the core dies via the through silicon vias TSV without a need to be transmitted to the memory device 200 at high speed via an existing interposer, power consumed during the signal transmission may be reduced. In addition, in generating signals with multi-phase in the TSV macros of the logic die 100, because only fewer clock signals than the number of multi-phases can be distributed to the TSV macros, routing resource for distributing clock signals to the TSV macros may be reduced, and because a portion of the transmission path of the clock signals provided to the TSV macros can be shared, skew between signals having multi-phase may be reduced.

Figure 2A:
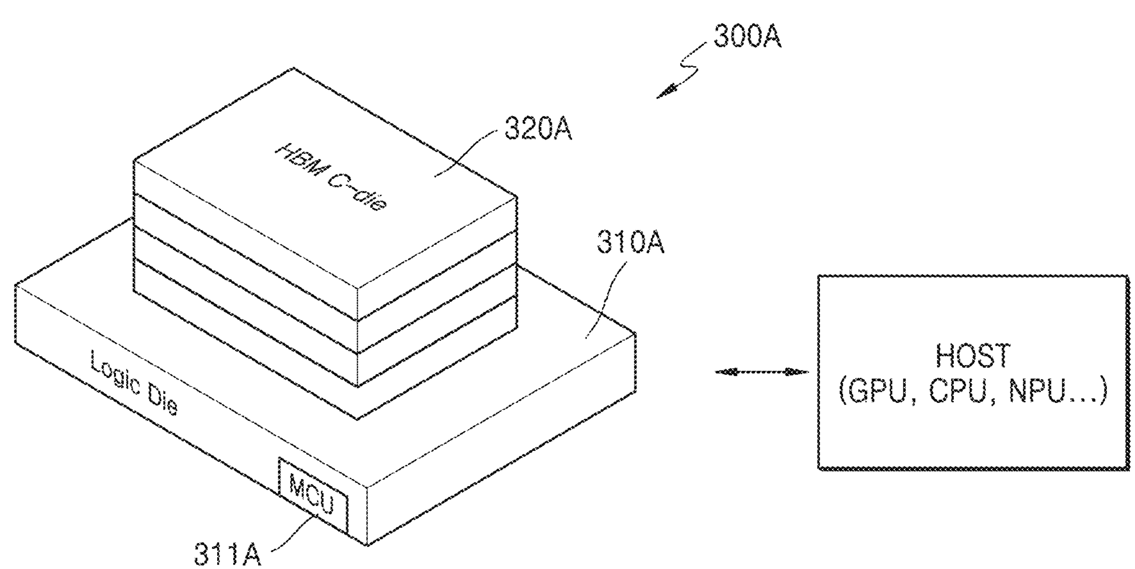
FIGS. 2A and 2B are diagrams of examples of semiconductor devices including high bandwidth memories (HBMs) according to some implementations.
Figure 2B:
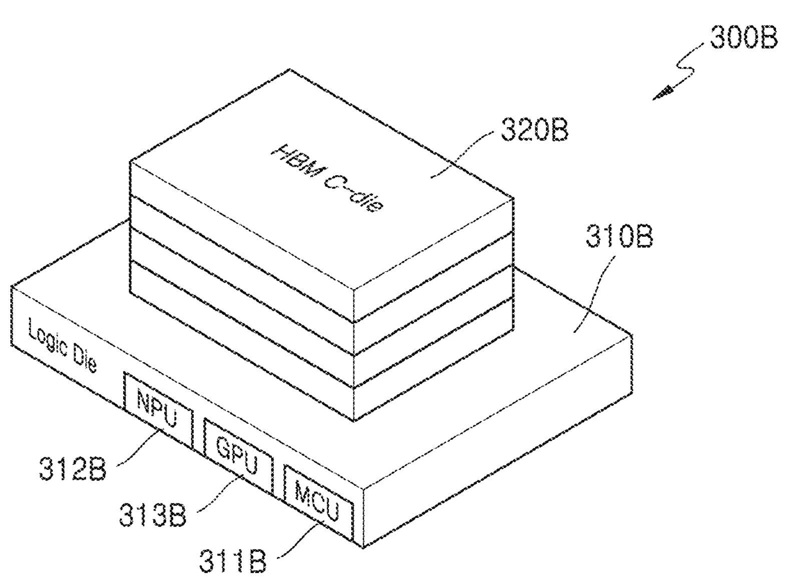

FIGS. 2A and 2B are diagrams of examples of semiconductor devices including the HBMs, respectively according to some implementations. In FIG. 2A, a semiconductor device 300A may include the HBM. The semiconductor device 300A may include the HBM in which a plurality of dies are stacked, and as an example, may include a plurality of core dies 320A (for example, HBM core dies C-die) which are stacked in a three-dimensional (3D) form on and above the logic die 310A. The logic die 310A may also itself function as a host, or may control a memory operation on the plurality of core dies 320A in response to a request from an external host. For example, the external host may include a CPU, a GPU, a NPU, an APU, an AP, etc. Although not illustrated in FIG. 2A, the logic die 310A may be electrically connected to a printed circuit board (PCB) via a plurality of bumps or connection terminals, and the semiconductor device 300A may be implemented as a semiconductor package including a PCB.

The logic die 310A may include a memory control unit (MCU) 311A, and may transmit various signals to the plurality of core dies 320A by controlling memory operations on the HBM C-dies 320A. As an example, the logic die 310A may transmit various signals having different phases to the plurality of core dies 320A via the plurality of TSV macros and through silicon vias TSV, and because only a relatively small number of clock signals are distributed to the TSV macros in generating signals having multi-phase, the routing resources of clock signals related to the generation of signals having multi-phase may be reduced, and the skew between signals having multi-phase may be reduced.

On the other hand, in FIG. 2B, the semiconductor device 300B may include a logic die 310B and a plurality of core dies 320B stacked on the logic die 310B, and the logic die 310B may include an MCU 311B. In addition, the logic die 310B may include various processing devices, such as NPU 312B and GPU 313B as the functions of the external host are performed, and although not illustrated in FIG. 2B, other various types of processing devices, which provide data access requests, may also be further included in the logic die 310B.

When the HBMs are implemented in the structures as illustrated in FIGS. 2A and 2B, especially when a logic die includes processing devices, such as an NPU and a GPU, which operate at high performance, heat generation by the logic die may increase. According to some implementations, the logic die may transmit various signals to the core dies based on multi-phase clock signals having a relatively low frequency, and the heat generation issue caused by the logic die may be reduced. In addition, because the logic die may generate signals having multi-phase by distributing only clock signals having relatively less number, power consumed by a clock distribution network may be reduced, clock routing resource may be reduced, and phase skew between signals may be reduced.

Figure 3:
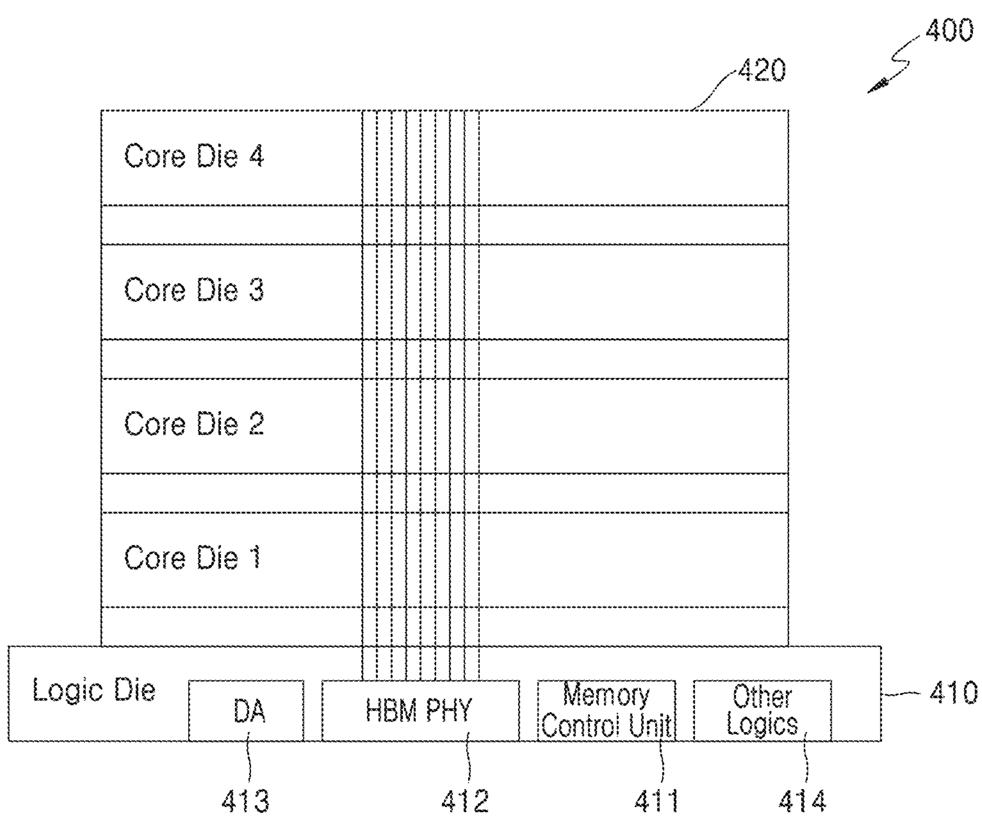
FIG. 3 is a cross-sectional view of an example of an HBM according to some implementations

FIG. 3 is a cross-sectional view of an example of an HBM according to some implementations. In FIG. 3, an HBM 400, implemented as a semiconductor device, may include a logic die 410 and a plurality of core dies, and in FIG. 3, an example is illustrated in which first through fourth core dies 420 are stacked on the logic die 410.

The logic die 410 may include a memory control unit 411, an HBM PHY region 412, a direct access (DA) region 413, and other logics 414. The memory control unit 411 may generate the command/address CMD/ADD for controlling a memory operation according to a request from an internal or external host of the HBM 400. The HBM PHY region 412 may include a plurality of through silicon vias TSV, and the command/address CMD/ADD, the data DATA, and various clock signals may be transmitted to the first to fourth core dies 420 via the HBM PHY region 412. The DA region 413 may perform a function of direct communication with an external test equipment of the HBM 400 in a test mode of the HBM 400. For example, various signals provided by an external test equipment may be provided to the first to fourth core dies 420 via the DA region 413 and the HBM PHY region 412.

On the other hand, the other logics 414 may include various types of logic circuits applicable to the HBM 400. For example, as the logic die 410 functions as a host, the other logics 414 may include various processing devices, such as a CPU, a GPU, an APU, and an NPU. In addition, the logic die 410 may communicate with an external semiconductor chip (or semiconductor die), and other logics 414 may also include a universal chip interconnect express (UCIe) module to support an interface protocol between semiconductor chips or semiconductor dies.

Figure 4A:
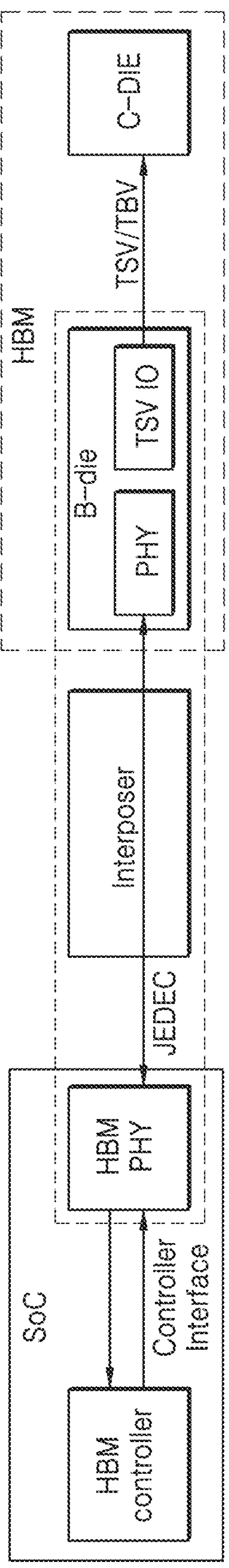
FIGS. 4A and 4B are schematic diagrams of examples between logic dies and core dies according to some implementations.
Figure 4B:
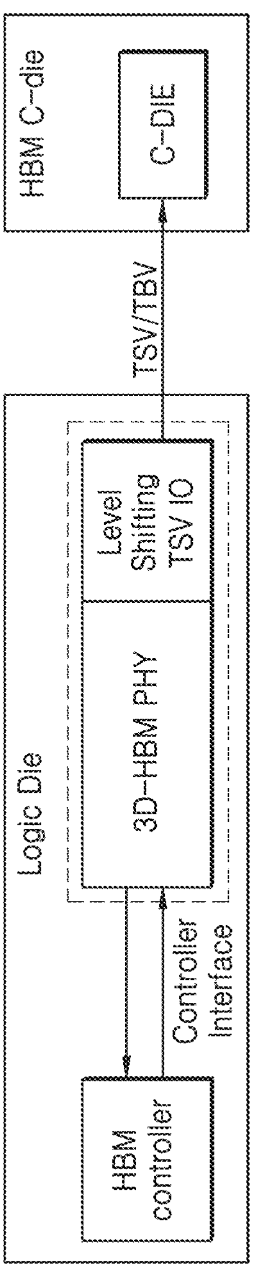

FIGS. 4A and 4B are schematic diagrams of examples between logic dies and core dies according to some implementations. FIG. 4A illustrates a case in which a system on chip (SoC) and an HBM communicate through an interposer according to a conventional method, and FIG. 4B illustrates communication between a logic die and an HBM C-die when a plurality of core dies are stacked in a 3D structure on the logic die according to some implementations.

In FIG. 4A, as a host including a memory controller, a processing unit, such as a CPU and a GPU, or an SoC may be mounted on an interposer separately from the HBM. Assuming that an SoC and one or more HBMs are mounted on the interposer in a system including an existing HBM, the SoC may include an HBM controller and the HBM PHY region, and the HBM controller and the HBM PHY region may communicate the command/address CMD/ADD and data DATA according to a certain controller interface such as a double data rate (DDR) PHY interface (DFI). In addition, the HBM PHY region of the SoC may communicate with a PHY region arranged on a buffer die of the HBM via the interposer, and as an example, the SoC may exchange the command/address CMD/ADD and data DATA with the HBM based on a high-speed communication according to the JEDEC interface. The buffer die of the HBM may transmit the command/address CMD/ADD and data DATA to the plurality of core dies stacked an HBM upper portion of the buffer die via the through silicon vias TSV, and may include a TSV input/output circuit for signal transmission via the through silicon vias TSV.

On the other hand, according to a structure in which a plurality of core dies are directly stacked on the upper portion of the logic die according to FIG. 4B, there may be no need to perform a high-speed communication based on the JEDEC interface via the interposer, in transmitting the command/address CMD/ADD and data DATA to the core dies, and in addition, in an existing HBM structure, a buffer die may be removed, or a portion of components of the buffer die may be integrated on the logic die in the present embodiment. The logic die may include the HBM controller and the HBM PHY region, and as the plurality of core dies are vertically stacked on the logic die, the HBM PHY region of the logic die may be referred to as a 3D-HBM PHY region. In addition, the HBM controller and the HBM PHY region may communicate the command/address CMD/ADD and data DATA with each other via a certain interface such as the DFI.

As the HBM PHY region of the logic die performs communication with the plurality of core dies via the through silicon vias TSV, the HBM PHY region of the logic die may include the TSV input/output circuit. In addition, when a domain of a voltage level between the HBM controller and the HBM PHY region is referred to as a controller domain, and a domain of a voltage level between the HBM PHY region and a core die is referred to as a TSV domain, the TSV input/output circuit may also perform a level shifting function for controlling a voltage level of the command/address CMD/ADD and data DATA transmitted via the through silicon vias TSV to a level corresponding to the TSV domain.

Hereinafter, examples in which the logic die outputs signals having various phases according to some implementations are described. As described above, the logic die may transmit multi-phase clock signals and various signals having multi phases to the core dies, and each core die may receive or latch the various signals described above in synchronization with the multi-phase clock signals. The command/address CMD/ADD and various clock signals may be exemplified as signals having multi phases transmitted to the core dies, and the command/address CMD/ADD may include a column address, a row address, a bank address, or the like, but the embodiments may not need to be limited to particular types of signals.

Figure 5A:
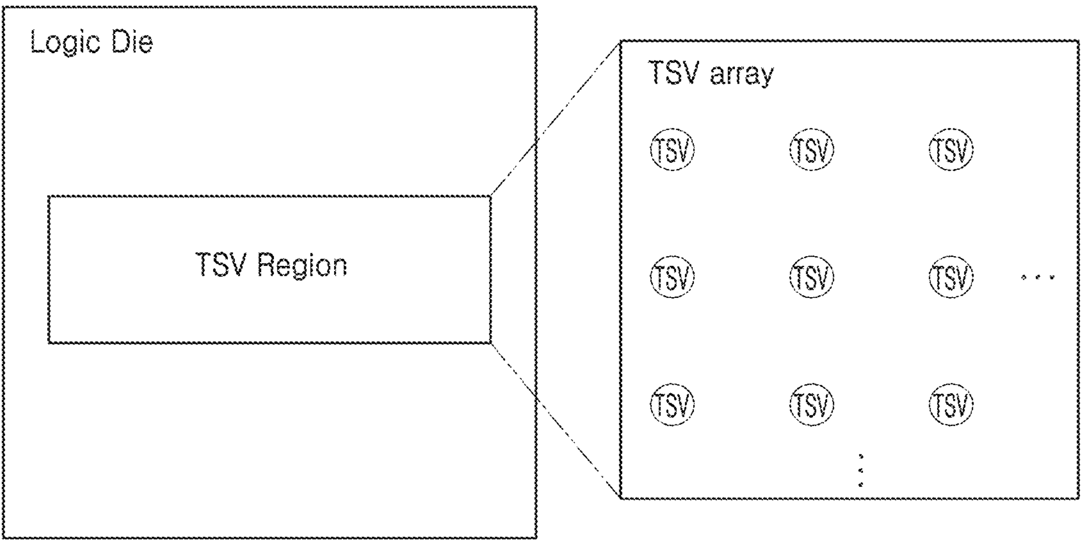
FIGS. 5A and 5B are diagrams of examples of through silicon via (TSV) regions and TSV macros provided on a logic die according to some implementations.
Figure 5B:
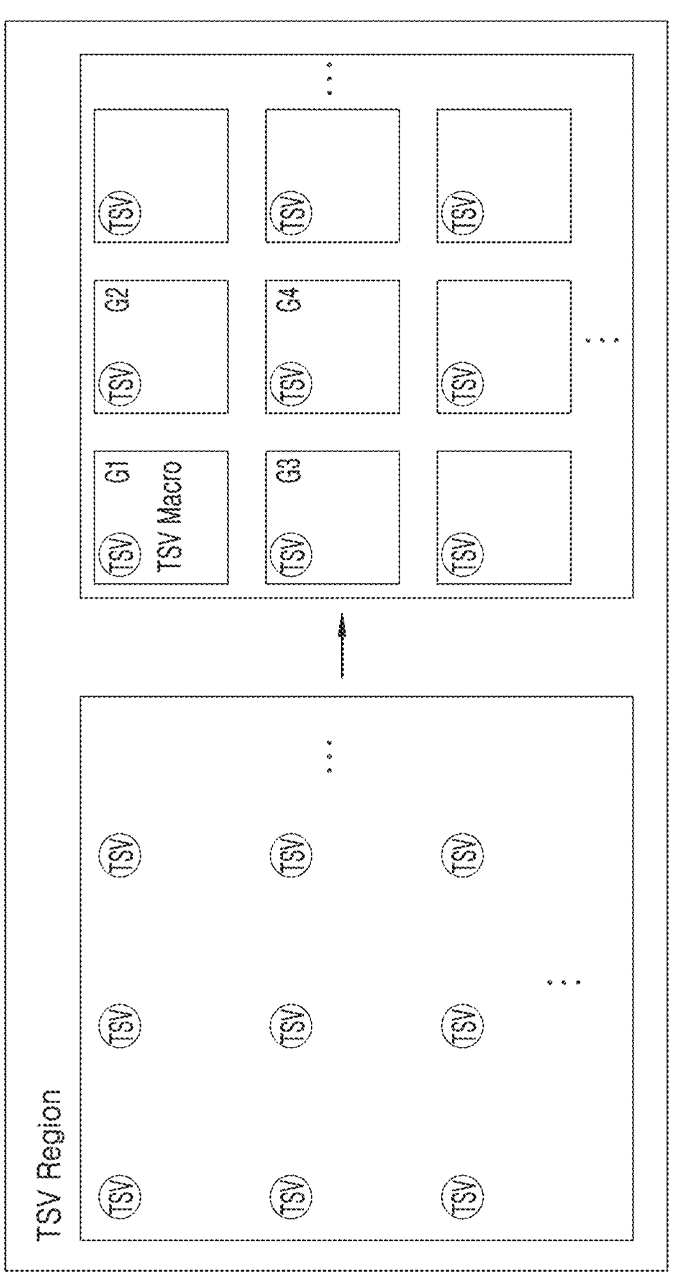

FIGS. 5A and 5B are diagrams of examples of TSV regions and TSV macros provided on the logic die according to some implementations. In FIGS. 5A and 5B, the logic die may include the TSV region in which a plurality of through silicon vias TSV are arranged in an array form, and the TSV region may be provided in an interface circuit described in the embodiment described above or in an HBM PHY. In addition, as plurality of through silicon vias TSV are arranged in an array form, there may be a certain space between the through silicon vias TSV. The TSV macro may represent a set of circuits related to processing of the signals transceived via the through silicon via TSV, or may be referred to as a region in which the circuits are arranged.

In addition, each TSV macro may be arranged in correspondence to one through silicon via TSV, or may be a configuration arranged in correspondence to two or more through silicon vias TSV. In addition, the TSV macro may be defined as a configuration including a corresponding through silicon via TSV, or as a configuration including circuits related to the through silicon via TSV without including a corresponding through silicon via TSV. In addition, a size of the TSV macro may be defined as equal to or less than a size of the space between each of the through silicon vias TSV.

In some implementations, a semiconductor device may include a plurality of metal layers in which metal wires are respectively arranged, and various circuits provided in the TSV macro may be implemented by using some of lower metal layers among the plurality of metal layers. Accordingly, metal wires for transmitting various signals may be arranged on some metal layers on the TSV macro, and some signals among various signals provided to the TSV macro may be transmitted via the metal wires arranged on an upper portion of the TSV macro. In addition, as there are spaces between each of the TSV macros, some other signals among the various signals described above may be transmitted via the metal wires arranged between the TSV macros, and as an example, the multi-phase clock signals in the embodiment described above as an example may be transmitted via the metal wires arranged between the TSV macros.

The plurality of TSV macros illustrated in FIGS. 5A and 5B may be classified into a plurality of groups according to phases of signals transmitted to the core dies. For example, when the signals are transmitted based on four phases, the plurality of TSV macros may be classified into first through fourth groups G1 through G4, the TSV macros of the first group G1 may output signals having a phase of approximately 0 degrees via a corresponding Through silicon via TSV, the TSV macros of the second group G2 may output signals having a phase of approximately 90 degrees via a corresponding Through silicon via TSV, the TSV macros of the third group G3 may output signals having a phase of approximately 180 degrees via a corresponding Through silicon via TSV, and the TSV macros of the fourth group G4 may output signals having a phase of approximately 270 degrees via a corresponding Through silicon via TSV. For example, a plurality of bits of the command/address CMD/ADD may be transmitted to the core dies via the TSV macros of the first through fourth groups G1 through G4, and the phases of the signals output by the TSV macros may be adjusted by using the signal processing of the circuits included in the TSV macros.

Figure 6A:
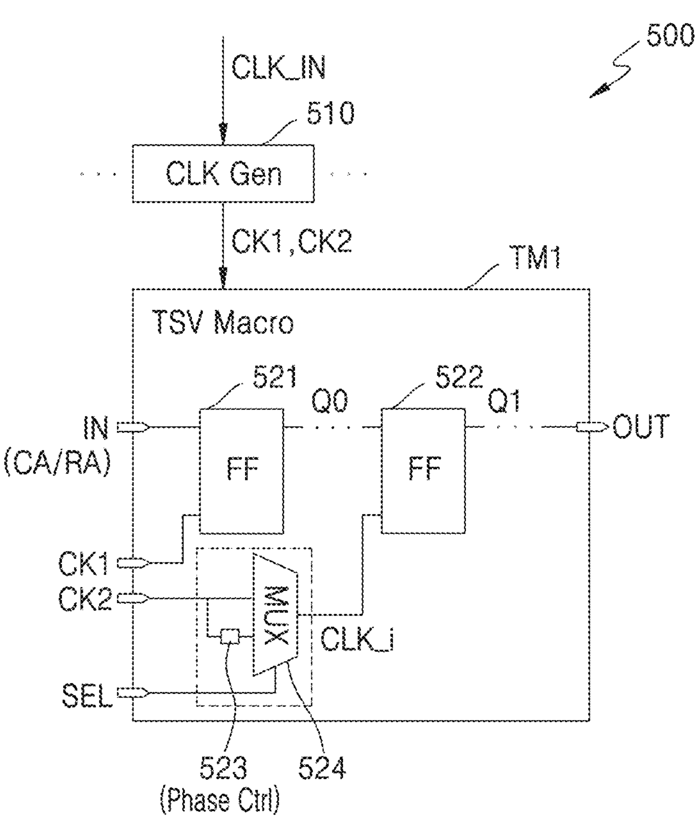
FIGS. 6A and 6B are block diagrams of examples of logic dies according to some implementations.
Figure 6B:
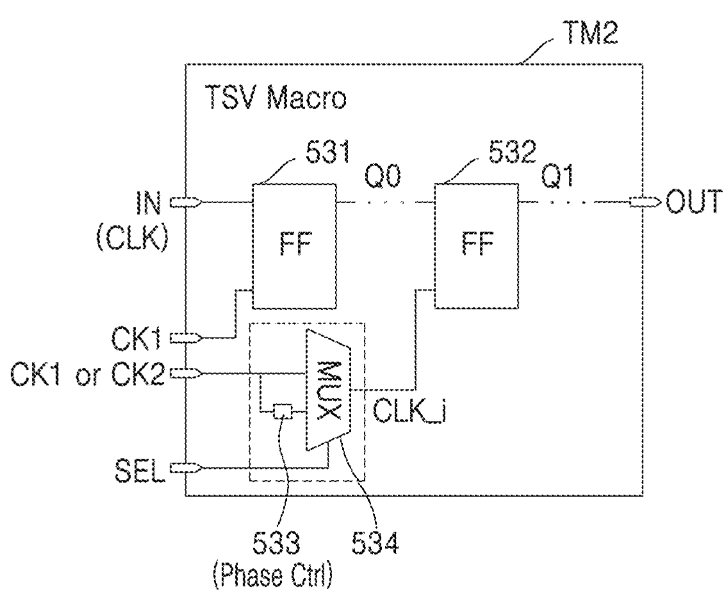

FIGS. 6A and 6B are block diagrams of examples of a logic die according to some implementations. In FIG. 6A, a logic die 500 may include a clock generator 510, and the clock generator 510 may generate at least two clock signals having different phases from each other based on an input clock CLK_IN. In some implementations, when two clock signals (for example, a first clock signal CK1 and a second clock signal CK2) having different phases from each other are distributed to the TSV macros to generate signals having multi phases, the clock generator 510 may generate the first and second clock signals CK1 and CK2. In addition, the clock generator 510 may generate the clock signals having three or more different phases, and only the first and second clock signals CK1 and CK2 may also be selectively distributed to the TSV macros. Assuming that the first through fourth clock signals have phase difference of approximately 90 degrees from each other, in FIG. 5, a case is illustrated in which the first clock signal CK1 having a phase of approximately 0 degrees and the second clock signal CK2 having a phase of approximately 90 degrees among the first through fourth clock signals CLI through CL4 are selectively distributed to the TSV macros.

On the other hand, as described above, various signals having multi phases may be transmitted to the core dies, and in FIG. 6A, a case is illustrated in which column/row addresses CA/RA included in the command/address CMD/ADD are provided as input to the first TSV macro TM1. Assuming that the first TSV macro TM1 receives the column address CA, the first TSV macro TM1 may include a plurality of receivers receiving and outputting the column address CA in synchronization with an input clock, and as an implementation example, each receiver may include a flip-flop FF. As an example, it is assumed that a first receiver 521 receives the column address CA input to the first TSV macro TM1, and a second receiver 522 receives the column address CA outputted by the first receiver 521 and generates an output OUT of the first TSV macro TM1.

Each of the plurality of TSV macros may include a first clock input terminal and a second clock input terminal, and the same clock signal (for example, the first clock signal CK1) may be commonly provided to the first clock input terminals of the plurality of TSV macros. In addition, any one clock signal among the first through fourth clock signals CK1 through CK4 may be selectively provided to the second clock input terminal. For example, when only the first and second clock signals CK1 and CK2 among the first through fourth clock signals CK1 through CK4 are distributed to the plurality of TSV macros, the first clock signal CK1 may be provided to the second clock input terminal of some TSV macros among the plurality of TSV macros, and the second clock signal CK2 may be provided to the second clock input terminal of the other TSV macros. In the example illustrated in FIG. 6A, an example is illustrated in which the second clock signal CK2 is provided to the second clock input terminal of the first TSV macro TM1.

The first TSV macro TM1 may further include a phase controller 523 and a selector 524, and the phase controller 523 may change and output the phase of the second clock signal CK2. In some implementations, the phase controller 523 may include a phase delayer which delays the phase by approximately 90 degrees, may include an inverter which reverses the phase by approximately 180 degrees, or in addition, may include circuits capable of changing the phase of the clock signal by various angles. In addition, in FIG. 6A, the phase controller 523 is illustrated as generating one output, but may also generate two or more outputs having different phases.

The selector 524 may receive the second clock signal CK2 and the output of the phase controller 523, and may output any one clock signal as an internal clock CLK_i in response to a phase selection signal SEL. The second receiver 522 may output the column address CA in synchronization with the internal clock CLK_i from the selector 524, and accordingly, the phase of the column address CA may be controlled based on the phase of the internal clock CLK_i. For example, when it is assumed that the first clock signal CK1 has a phase of approximately 0 degrees and the second clock signal CK2 has a phase of approximately 90 degrees, and the selector 524 outputs the second clock signal CK2, the phase of the column address CA may correspond to approximately 90 degrees. Alternatively, when the selector 524 outputs a clock signal corresponding to approximately 180 degrees, the phase of the column address CA may correspond to approximately 180 degrees. In some implementations, when the selector 524 outputs a clock signal obtained by inverting the second clock signal CK2, the phase of the column address CA may correspond to approximately 270 degrees.

On the other hand, the second TSV macro TM2 illustrated in FIG. 6B may correspond to any one of the plurality of TSV macros which transmit multi-phase clock signals to the core die.

The second TSV macro TM2 may receive the clock signal or a reference clock as an input IN. The second TSV macro TM2 may also include a first receiver 531, a second receiver 532, a phase controller 533, and a selector 534, the first clock signal CK1 having a phase of approximately 0 degrees may be provided to the first clock input terminal, and the first clock signal CK1 or the second clock signal CK2 having a phase of approximately 90 degrees may be provided to the second clock input terminal. The phase controller 533 may change and output the phase of the first clock signal CK1 or the second clock signal CK2, which is provided to the second clock input terminal, and the selector 534 may output the second clock signal CK2 or may output the second clock signal CK2 having the changed phase as the internal clock CLK_i in response to the phase selection signal SEL.

Assuming that the second TSV macro TM2 transmits a clock signal having a phase of approximately 90 degrees among the multi-phase clock signals, as the second clock signal CK2 is input to the second clock input terminal and the second clock signal CK2 is provided to the second receiver 532, a clock signal having a phase of approximately 90 degrees may be provided as an output OUT. In addition, assuming that the second TSV macro TM2 transmits a clock signal having a phase of approximately 180 degrees among the multi-phase clock signals, the first clock signal CK1 may be input to the second clock input terminal and an inverted clock signal of the first clock signal CK1 may be provided to the second receiver 532, and accordingly, a clock signal having a phase of approximately 180 degrees may be provided as the output OUT. In addition, assuming that the second TSV macro TM2 transmits a clock signal having a phase of approximately 270 degrees among the multi-phase clock signals, the second clock signal CK2 may be input to the second clock input terminal and an inverted clock signal of the second clock signal CK2 may be provided to the second receiver 532, and accordingly, a clock signal having a phase of approximately 270 degrees may be provided as the output OUT.

According to the implementations described above illustrated in FIGS. 6A and 6B, by arranging a circuit for selecting clock signals with various phases, together with a circuit for changing or inverting the phase of the clock signal in the TSV macro, in generating signals having multi phases by the TSV macros, a routing structure of metal wires transmitting clock signals may be simplified and power consumption may be reduced.

Figure 7:
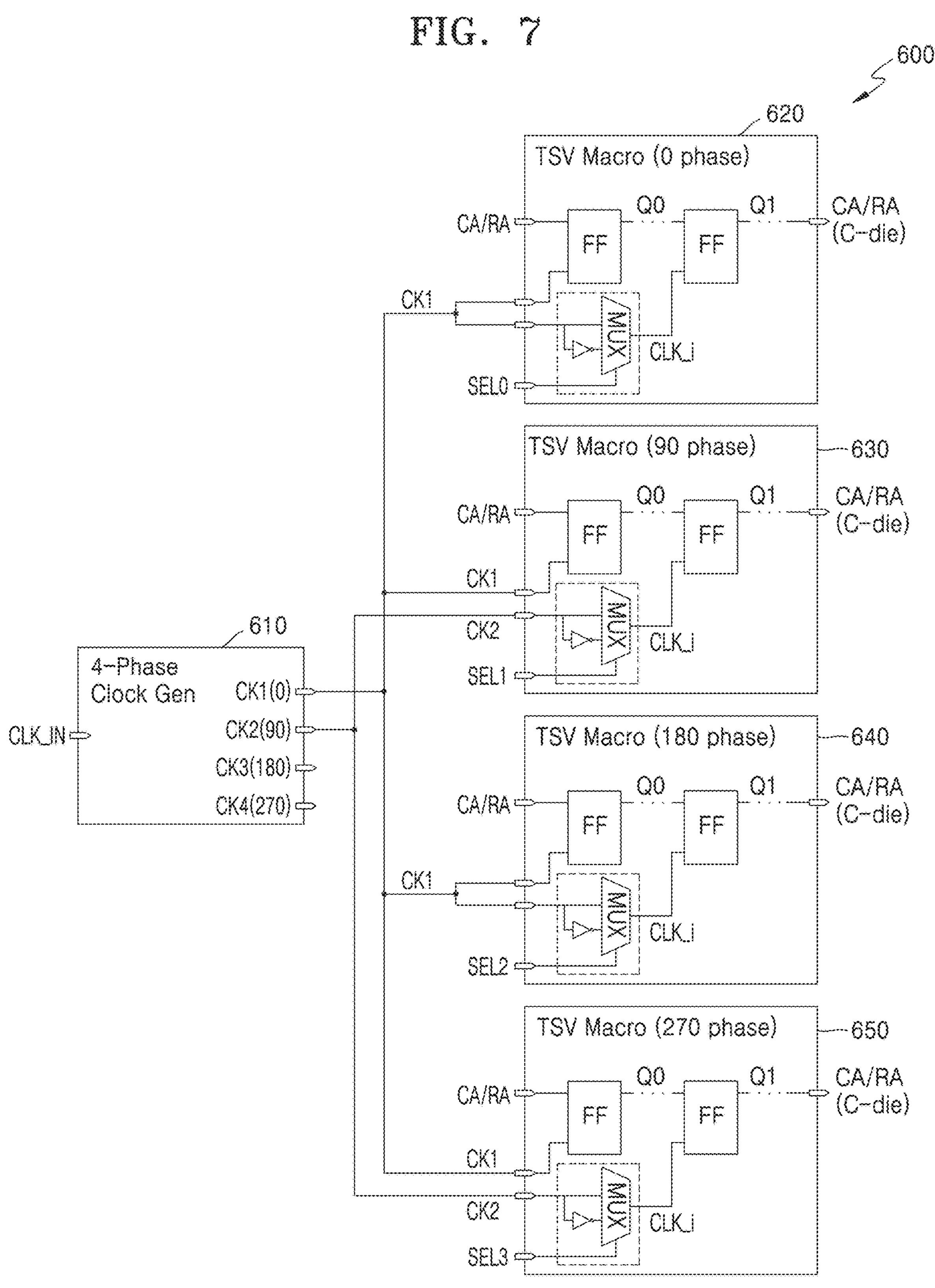
FIG. 7 is a diagram of an example of a logic die generating 4-phase signals according to some implementations.
Figure 8A:
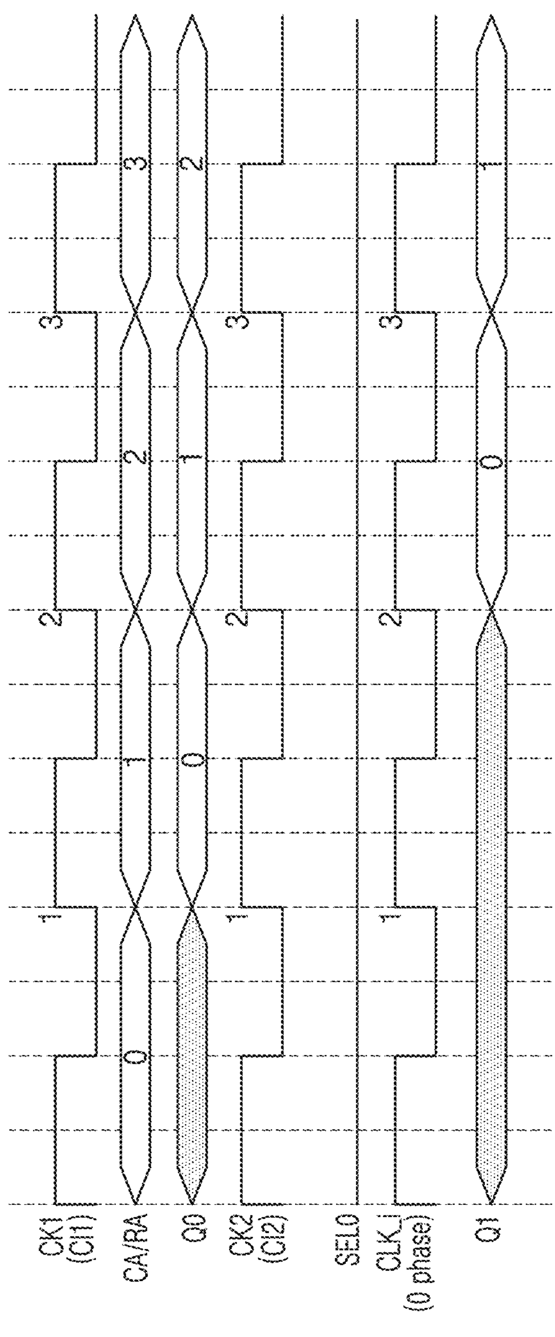
FIGS. 8A through 8D are waveform diagrams of operation examples of the logic die illustrated in FIG. 7 according to some implementations.
Figure 8B:
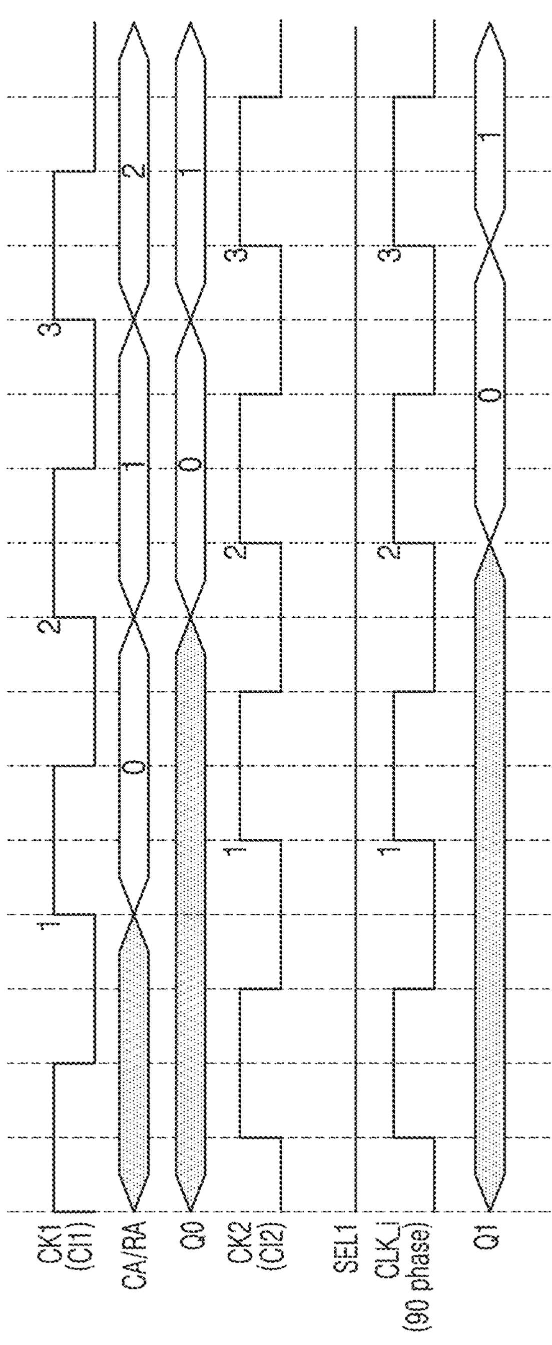
Figure 8C:
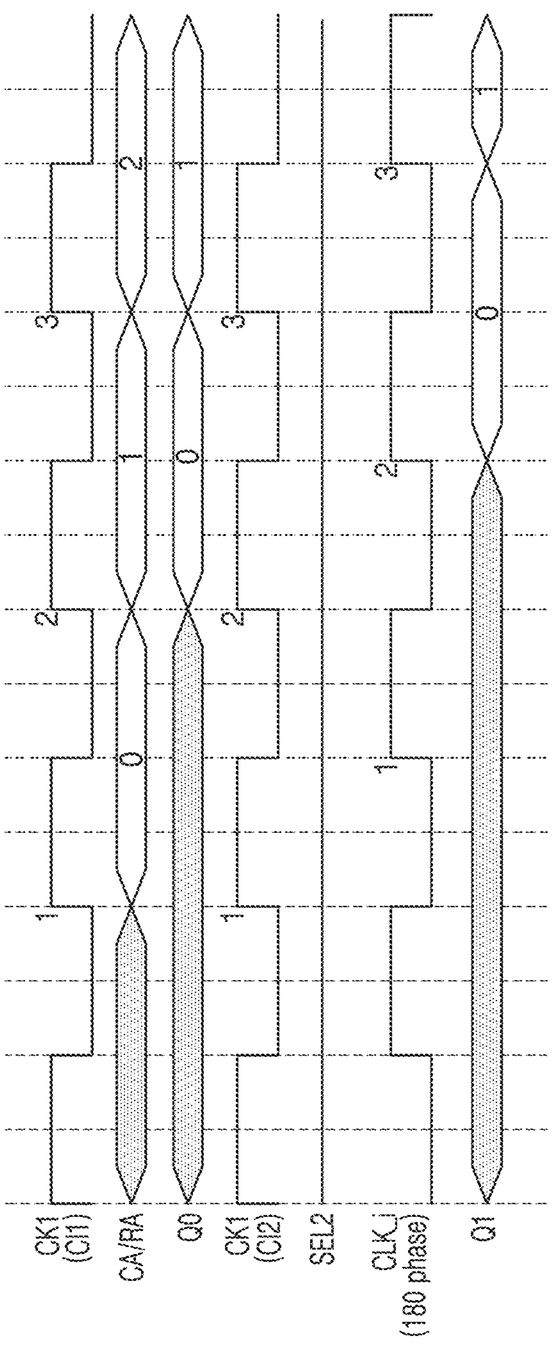
Figure 8D:
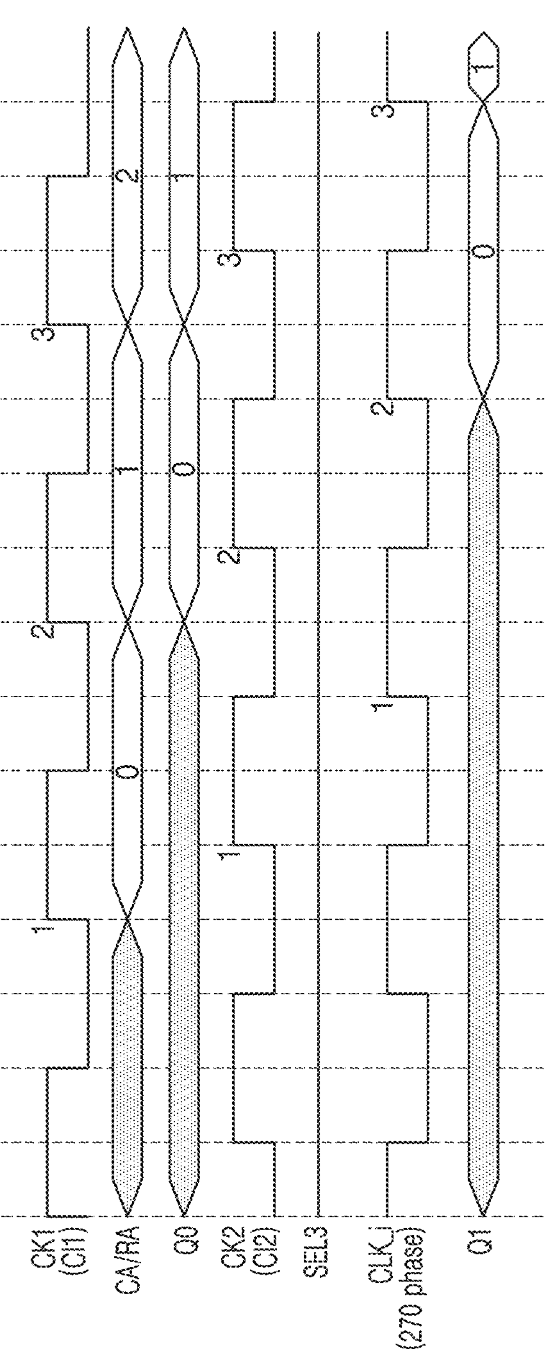

FIG. 7 is a diagram of an example of a logic die generating 4-phase signals according to some implementations. In FIG. 7, a case, in which the logic die 600 transmits the column/row addresses CA/RA having 4-phase to a core die is illustrated. The logic die 600 may include a 4-phase clock generator 610 and first through fourth TSV macros (620, 630, 640, and 650), and the 4-phase clock generator 610 may generate the first through fourth clock signals CK1 through CK4 sequentially having a phase difference of approximately 90 degrees. In addition, the first through fourth TSV macros (620, 630, 640, and 650) may receive in parallel the column/row addresses CA/RA including a plurality of bits, generate bits of the column/row addresses CA/RA having a 4-phase, and in the embodiment illustrated in FIG. 7, the first and second clock signals CK1 and CK2 among the first through fourth clock signals CK1 through CK4 may be distributed to the first through fourth TSV macros (620, 630, 640, and 650).

In some implementations, the first clock signal CK1 may have a phase of approximately 0 degrees, and may be commonly provided to first clock input terminals of the first through fourth TSV macros (620, 630, 640, and 650). In addition, the second clock signal CK2 may have a phase of approximately 90 degrees, the first clock signal CK1 may be provided to the second clock input terminals of the first and third TSV macros 620 and 640, and the second clock signal CK2 may be provided to the second clock input terminals of the second and fourth TSV macros 630 and 650.

A first output Q0 of a first receiver of the first TSV macro 620 may have a phase of approximately 0 degrees as the first output Q0 is synchronized with the first clock signal CK1 provided to the first clock input terminal. In addition, a second output Q1 of a second receiver of the first TSV macro 620 may be synchronized with the internal clock CLK_i output by a selector MUX. In this case, as the first clock signal CK1 is input to the second clock input terminal of the first TSV macro 620 and the first clock signal CK1 is output as the internal clock CLK_i in response to a first phase selection signal SEL0, the second output Q1 of the second receiver may have a phase of approximately 0 degrees. Accordingly, the phase of the column/row addresses CA/RA output by the first TSV macro 620 and transmitted to the core die may correspond to approximately 0 degrees.

On the other hand, the first output Q0 of the first receiver of the second TSV macro 630 may have a phase of approximately 0 degrees as the first output Q0 is synchronized with the first clock signal CK1. In addition, as the second clock signal CK2 is input to the second clock input terminal of the second TSV macro 630 and the phase controller includes an inverter, the inverted clock signal of the second clock signal CK2 may be provided as the input of the selector MUX together with the second clock signal CK2. In addition, as the second clock signal CK2 is output as the internal clock CLK_i in response to a second phase selection signal SEL1, the second output Q1 of the second receiver may have a phase of approximately 90 degrees. Accordingly, the phase of the column/row addresses CA/RA output by the second TSV macro 630 and transmitted to the core die may correspond to approximately 0 degrees.

On the other hand, the first output Q0 of the first receiver of a third TSV macro 640 may have a phase of approximately 0 degrees as the first output Q0 is synchronized with the first clock signal CK1. In addition, as the first clock signal CK1 is input to the second clock input terminal of the third TSV macro 640 and an inverted clock signal of the first clock signal CK1 is output as the internal clock CLK_i in response to a third phase selection signal SEL2, the second output Q1 of the second receiver may have a phase of approximately 180 degrees. Accordingly, the phase of the column/row addresses CA/RA output by the third TSV macro 640 and transmitted to the core die may correspond to approximately 180 degrees.

In addition, the first output Q0 of the first receiver of a fourth TSV macro 650 may have a phase of approximately 0 degrees as the first output Q0 is synchronized with the first clock signal CK1. In addition, as the second clock signal CK2 is input to the second clock input terminal of the fourth TSV macro 650 and an inverted clock signal of the second clock signal CK2 is output as the internal clock CLK_i in response to a fourth phase selection signal SEL3, the second output Q1 of the second receiver may have a phase of approximately 270 degrees. Accordingly, the phase of the column/row addresses CA/RA output by the fourth TSV macro 650 and transmitted to the core die may correspond to approximately 270 degrees.

FIGS. 8A through 8D are waveform diagrams of operation examples of the logic die illustrated in FIG. 7 according to some implementations. In FIGS. 7, 8A, 8B, 8C, and 8D, the first clock signal CK1 may be commonly provided to a first clock input terminal CI1 of the first through fourth TSV macros (620, 630, 640, and 650), the first clock signal CK1 may be provided to a second clock input terminals CI2 of the first and third TSV macros 620 and 640, and the second clock signal CK2 may be provided to the second clock input terminals CI2 of the second and fourth TSV macros 630 and 650. In addition, in FIGS. 8A and 8C, a case is illustrated in which as first and third phase selection signals SEL0 and SEL2 have a logic low level, the clock signal input to the second clock input terminal CI2 is provided to the second receiver without being inverted, and in FIGS. 8B and 8D, a case is illustrated in which as second and fourth phase selection signals SEL1 and SEL3 have a logic high level, the clock signal input to the second clock input terminal CI2 is inverted and provided to the second receiver.

According to the signal processing in the first through fourth TSV macros (620, 630, 640, and 650), as illustrated in FIGS. 8A, 8B, 8C, and 8D, the phases of the column/row addresses CA/RA output by the first through fourth TSV macros (620, 630, 640, and 650) to the C-die core die may sequentially have a difference corresponding to approximately 90 degrees. In this case, to ensure that the column/row addresses CA/RA output by the first TSV macro 620 have most advanced phases, a preprocessing operation may be performed in the logic die 600 so that the column/row addresses CA/RA input to the first TSV macro 620 are input in advance by one cycle compared to other TSV macros.

Figure 9:
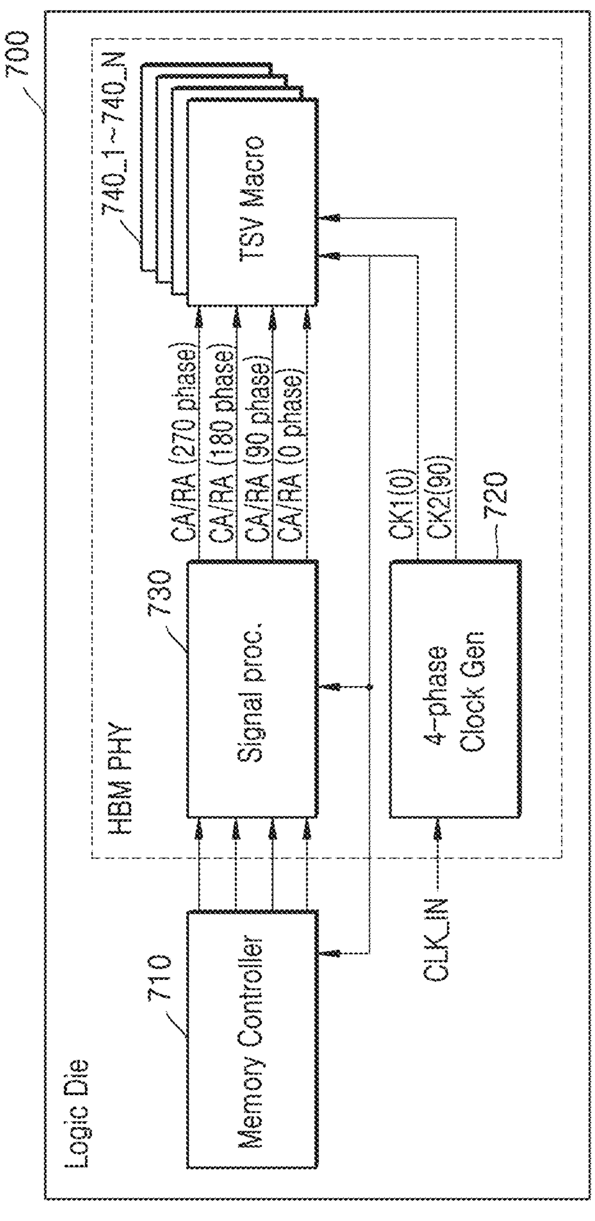
FIG. 9 is a block diagram of an example of a logic die according to some implementations.

FIG. 9 is a block diagram of an example of a logic die according to some implementations. A logic die 700 of FIG. 9 may be implemented to perform the operation in the embodiments illustrated in FIGS. 7 and 8A, 8B, 8C, and 8D, and in some implementations, may include a memory controller 710, a 4-phase clock generator 720, a signal processor 730, and TSV macros 740_1 through 740_N.

The memory controller 710 may provide the command/address CMD/ADD and data DATA to the HBM PHY based on a request from an external host or a host in the logic die 700, and as an example, may provide the column/row addresses CA/RA to the HBM PHY region. The signal processor 730 may process various signals provided by the memory controller 710 and provide the processed signals to the TSV macros 740_1 through 740_N, and as an example, may preprocess the column/row addresses CA/RA and provide the preprocessed column/row addresses CA/RA based on phases of the signals transmitted by the TSV macros 740_1 through 740_N. For example, the signal processor 730 may provide a plurality of bits of the column/row addresses CA/RA to the first through fourth TSV macros in a unit of four bits in parallel in relation with the 4-phase signal processing, and according to the embodiment illustrated in FIG. 8, may perform a preprocessing operation so that the column/row addresses CA/RA provided to a first TSV macro is input into the first TSV macro by one cycle ahead of other TSV macros.

On the other hand, the 4-phase clock generator 720 may generate the 4-phase clock signals by using a certain input clock CLK_IN, and only some clock signals among the 4-phase clock signals generated by the 4-phase clock generator 720 (for example, the first clock signal CK1 having a phase of approximately 0 degrees and the second clock signal CK2 having a phase of approximately 90 degrees) may be selectively distributed to the TSV macros 740_1 through 740_N. According to some implementations, each of the TSV macros 740_1 through 740_N may receive the first clock signal or the second clock signal, and based on a phase change operation thereon, a phase of a signal output by the TSV macro may be adjusted.

On the other hand, at least one clock signal among the 4-phase clock signals generated by the 4-phase clock generator 720 may be provided to another circuit block in the logic die 700, and as an example, the first clock signal CK1 may be provided to the memory controller 710 and the signal processor 730, and the memory controller 710, the signal processor 730, and the TSV macros 740_1 through 740_N may operate in synchronization with the same first clock signal CK1.

Figure 10:
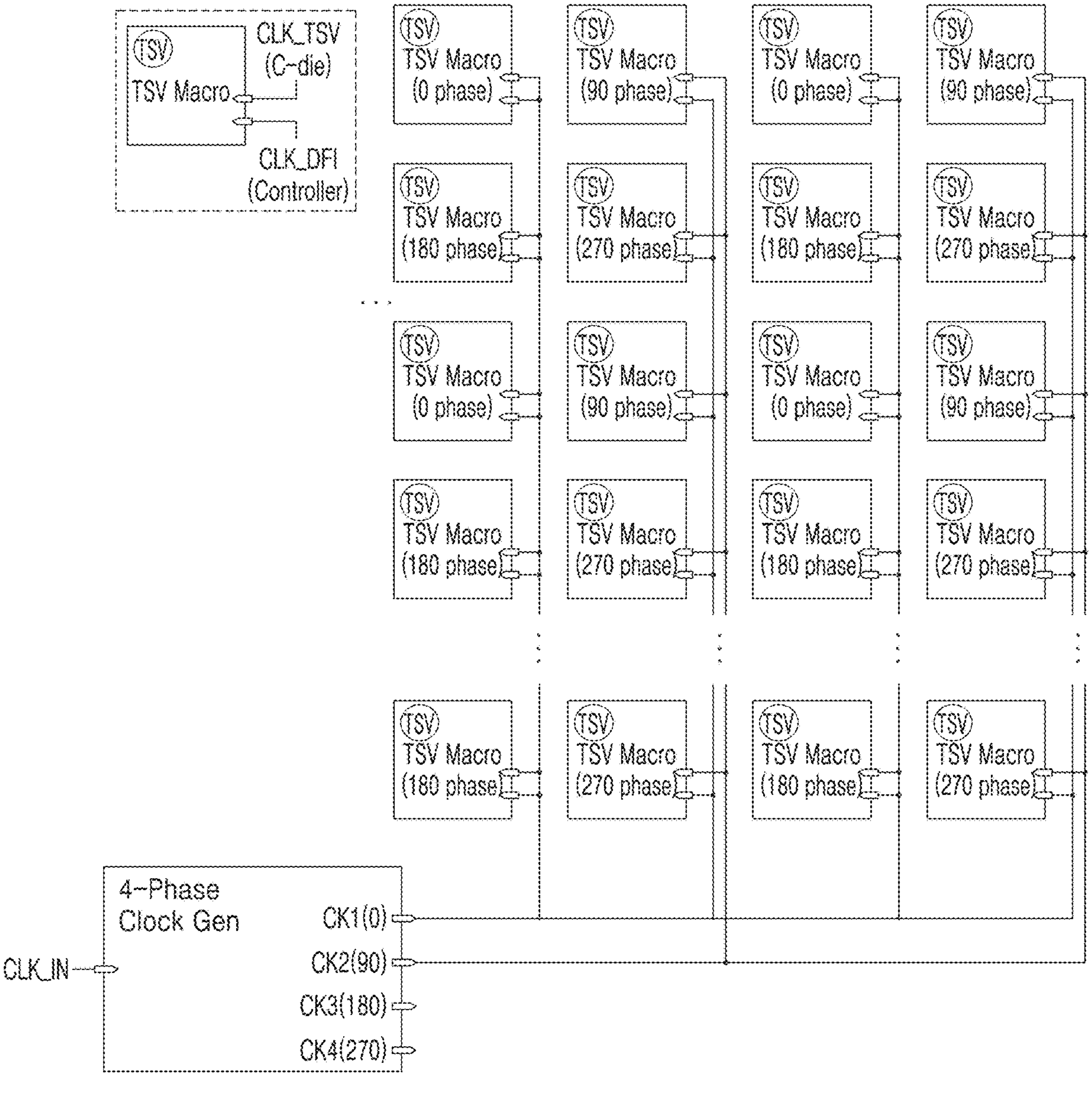
FIG. 10 is a diagram of a routing example of a multi-phase clock signal according to some implementations.

FIG. 10 is a diagram of a routing example of a multi-phase clock signal CLK according to some implementations. In the TSV macro illustrated in FIG. 10, the clock signal input to the first clock input terminal may have a phase related to DFI communication between the memory controller and the HBM PHY region, and accordingly, may be defined as a controller domain clock CLK_DFI. In addition, the clock signal input to the second clock input terminal may have a phase related to TSV communication between the HBM PHY region of the logic die and the core die, and accordingly, may be defined as a TSV domain clock CLK_TSV.

In FIG. 10, the logic die may include the plurality of through silicon vias TSV arranged in an array form, and the TSV macro may be defined in correspondence to spaces between each of the plurality of through silicon vias TSV. Each TSV macro may include one or more through silicon vias TSV, and the plurality of TSV macros may also have an array form.

In some implementations, assuming that the logic die performs communication based on 4-phase clock signals, the TSV macros which generate signals having a phase difference of approximately 90 degrees from each other in a first direction (for example, a horizontal direction) may be alternately arranged, and in addition, the TSV macros which generate signals with a phase difference of approximately 180 degrees from each other in a second direction (for example, a vertical direction) orthogonal to the first direction may be alternately arranged. For example, in one TSV macro row, the TSV macros of a first group outputting a signal of approximately 0 degrees and the TSV macros of a second group outputting a signal of approximately 90 degrees may be alternately arranged. In addition, in another TSV macro row, the TSV macros of a third group outputting a signal of approximately 180 degrees and the TSV macros of a fourth group outputting a signal of approximately 270 degrees may be alternately arranged.

On the other hand, in any one TSV macro row, the TSV macros of the first group outputting a signal of approximately 0 degrees and the TSV macros of the third group outputting a signal of approximately 180 degrees may be alternately arranged. In addition, in another TSV macro row, the TSV macros of the second group outputting a signal of approximately 90 degrees and the TSV macros of the fourth group outputting a signal of approximately 270 degrees may be alternately arranged.

In providing the first and second clock signals CK1 and CK2 to the first clock input terminal and the second clock input terminal of the TSV macros according to some implementations described above, the first clock signal CK1 may be provided in common to the first and second clock input terminals of the TSV macros of the first group and the TSV macros of the third group. Accordingly, for the TSV macros of the first group and the TSV macros of the third group, only metal wires transmitting the first clock signal CK1 may be arranged.

In addition, the first clock signal CK1 may be provided to the first clock input terminal, and the second clock signal CK2 may be provided to the second clock input terminal, of the TSV macros of the second group and the TSV macros of the fourth group. Accordingly, for the TSV macros of the second group and the TSV macros of the fourth group, only metal wires transmitting the first clock signal CK1 and the second clock signal CK2 may be arranged. In other words, according to some implementations, because metal wires transmitting clock signals in response to the plurality of TSV macros outputting signals of 4-phases may be reduced, the efficiency of routing of metal wires may be improved and power consumption may be reduced.

On the other hand, in FIG. 10, although a case is illustrated in which the metal wires transmitting the first and second clock signals CK1 and CK2 are arranged in spaces between the TSV macros, the present disclosure is not limited thereto, and the metal wires transmitting the first and second clock signals CK1 and CK2 may also be arranged in an upper region of the TSV macros. In addition, the arrangement of the TSV macros of a plurality of groups illustrated in FIG. 10 may be simply an example, and the TSV macros of the plurality of groups may be arranged in the TSV region.

Figure 11:
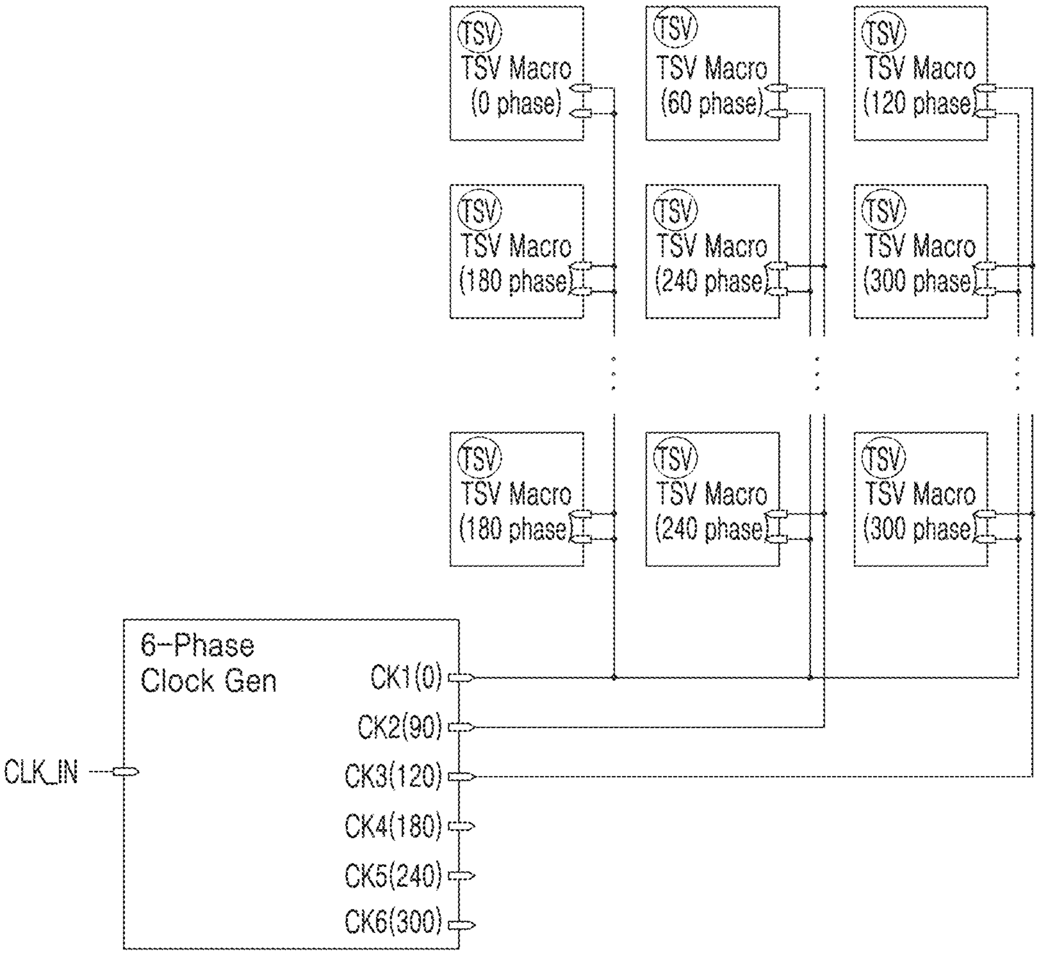
FIGS. 11 and 12 are block diagrams of examples of logic dies according to some implementations.
Figure 12:
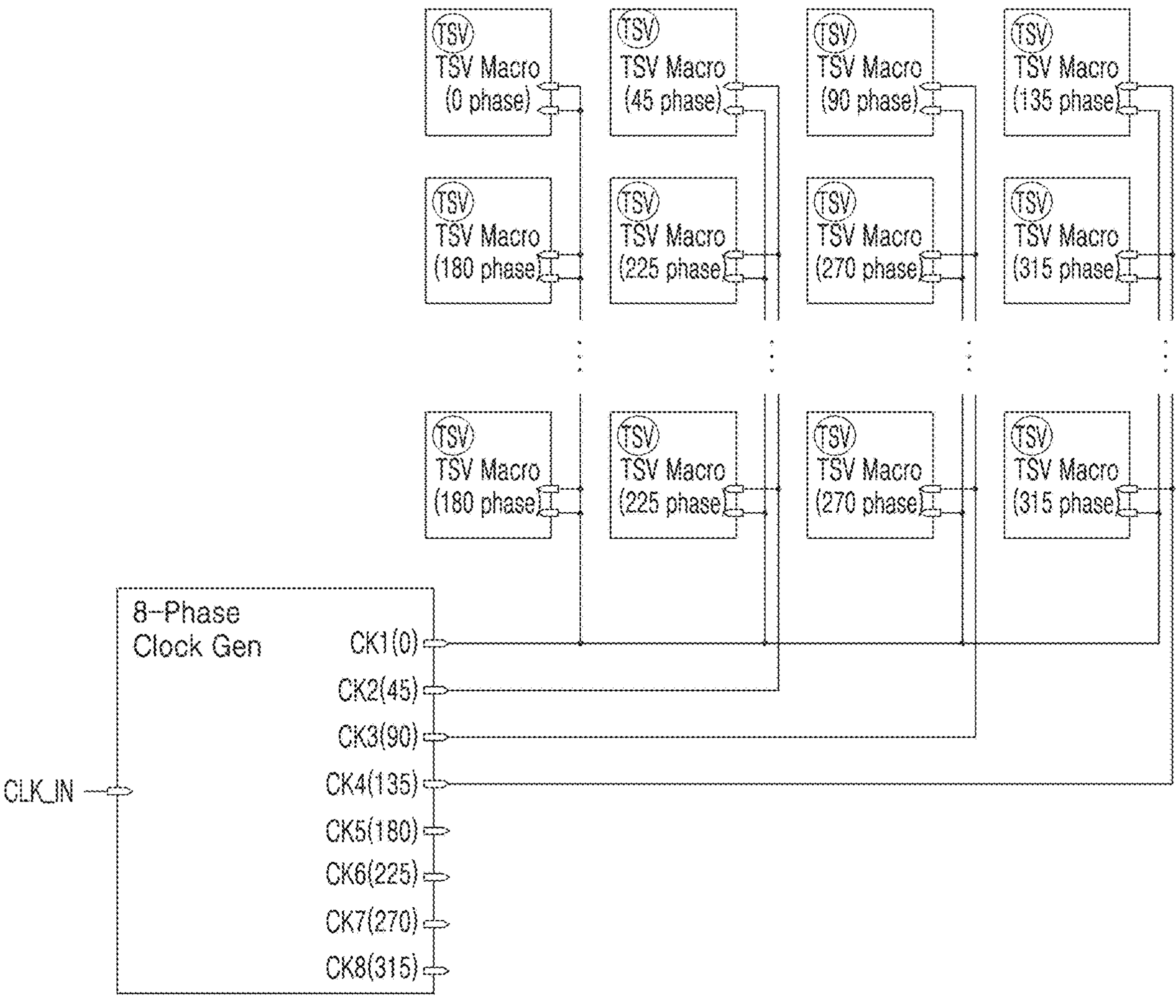

FIGS. 11 and 12 are block diagrams of examples of logic dies according to some implementations. In FIGS. 11 and 12, examples of logic dies in cases where the logic dies communicate signals having various numbers of phases are illustrated.

FIG. 11 illustrates an example of the logic die operating based on a 6-phase CLK, and the logic die may include a 6-phase clock Gen. For example, a 6-phase clock generator may generate first through sixth clock signals CK1 through CK6, and the first through sixth clock signals CK1 through CK6 may sequentially have a phase difference of approximately 60 degrees.

On the other hand, the TSV macros of the logic die may include TSV macros of first through sixth groups. For example, the TSV macros of the first group may output signals having a phase of approximately 0 degrees, the TSV macros of the second group may output signals having a phase of approximately 60 degrees, and the TSV macros of the third group may output signals having a phase of approximately 120 degrees. For example, the TSV macros of the fourth group may output signals having a phase of approximately 180 degrees, the TSV macros of a fifth group may output signals having a phase of approximately 240 degrees, and the TSV macros of a sixth group may output signals having a phase of approximately 300 degrees.

In some implementations, only some clock signals of the first through sixth clock signals CK1 through CK6 may be distributed to the TSV macros, and as an example, FIG. 11 illustrates that the first through third clock signals CK1 through CK3 are distributed to the TSV macros. For example, the first clock signal CK1 may be commonly provided to the first clock input terminals of the TSV macros of the first through sixth groups. In addition, the first clock signal CK1 may be provided to the second clock input terminals of the TSV macros of the first and fourth groups, the second clock signal CK2 may be provided to the second clock input terminals of the TSV macros of the second and fifth groups, and the third clock signal CK3 may be provided to the second clock input terminals of the TSV macros of the third and sixth groups.

On the other hand, FIG. 12 illustrates that the logic die operates based on an 8-phase CLK, the 8-phase clock signal may generate first through eighth clock signals CK1 through CK8, and the first through eighth clock signals CK1 through CK8 may sequentially have a phase difference of approximately 45 degrees. In addition, the TSV macros of the logic die may include the TSV macros of first through eighth groups, and the TSV macros of the first through eighth groups may output signals sequentially having a phase difference of approximately 45 degrees.

In some implementations, only some clock signals of the first through eighth clock signals CK1 through CK8 may be distributed to the TSV macros, and as an example, FIG. 12 illustrates that the first through fourth clock signals CK1 through CK4 are distributed to the TSV macros. For example, the first clock signal CK1 may be commonly provided to the first clock input terminals of the TSV macros of the first through eighth groups. In addition, the first clock signal CK1 may be provided to the second clock input terminals of the TSV macros of the first and fifth groups, the second clock signal CK2 may be provided to the second clock input terminals of the TSV macros of the second and sixth groups, the third clock signal CK3 may be provided to the second clock input terminals of the TSV macros of the third and seventh groups, and the fourth clock signal CK4 may be provided to the second clock input terminals of the TSV macros of the fourth and eighth groups.

Figure 13:
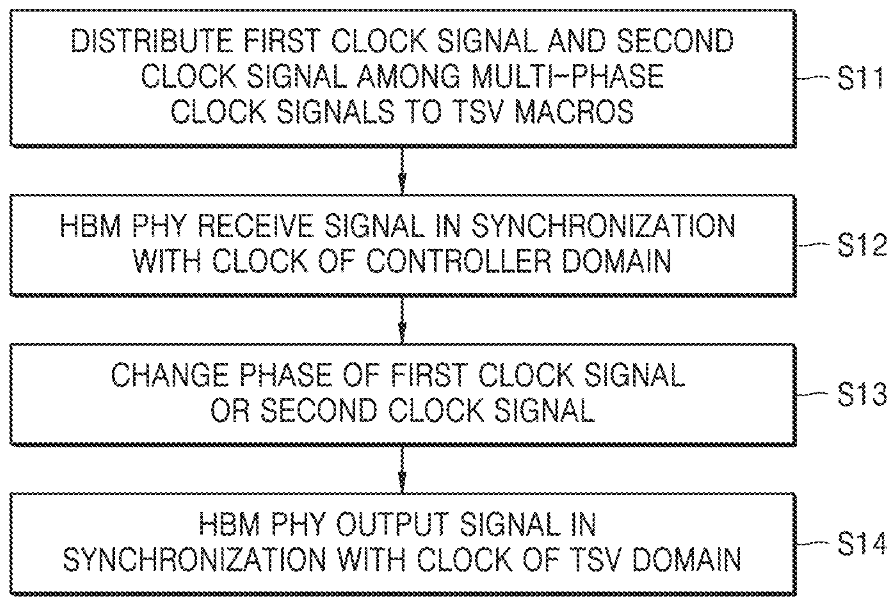
FIG. 13 is a flowchart of an example of an operating method of a semiconductor device according to some implementations.

FIG. 13 is a flowchart of an example of an operating method of a semiconductor device according to some implementations. In FIG. 13, the semiconductor device may include the HBM, the HBM may include a logic die and a plurality of core dies, which are vertically stacked in a 3D form, and the logic die and the plurality of core dies may exchange various signals via the through silicon vias TSV. In addition, the logic die may have a memory controller (or a memory control unit) and the HBM PHY, the HBM PHY region may communicate with the memory controller in a controller domain, and in addition, the HBM PHY region may communicate with a plurality of core dies in the TSV domain.

According to some implementations described above, the logic die may generate multi-phase clock signals and distribute some clock signals (for example, first and second clock signals) into a plurality of TSV macros (S11). The first clock signal may be commonly distributed to a first clock input terminals of the plurality of TSV macros described above, and the HBM PHY region may receive a signal in synchronization with a clock of the controller domain (S12). The clock of the controller domain may correspond to the first clock signal, and the first clock signal may have a phase of approximately 0 degrees.

On the other hand, the logic die may include a phase controller, the first clock signal or the second clock signal may be provided to the second clock input terminal of each of the plurality of TSV macros, and the phase controller may change the phase of the first clock signal or the second clock signal provided to the second clock input terminal (S13). The HBM PHY region may transmit a signal to the core die via the through silicon via TSV in synchronization with the clock of the TSV domain (S14). The clock of the TSV domain described above may correspond to the first clock signal or the second clock signal, or may correspond to a clock signal in which the phase of the first clock signal or the second clock signal has been changed. Accordingly, the TSV macros may transmit signals having various phases from the TSV domain to the core die.

Figure 14:
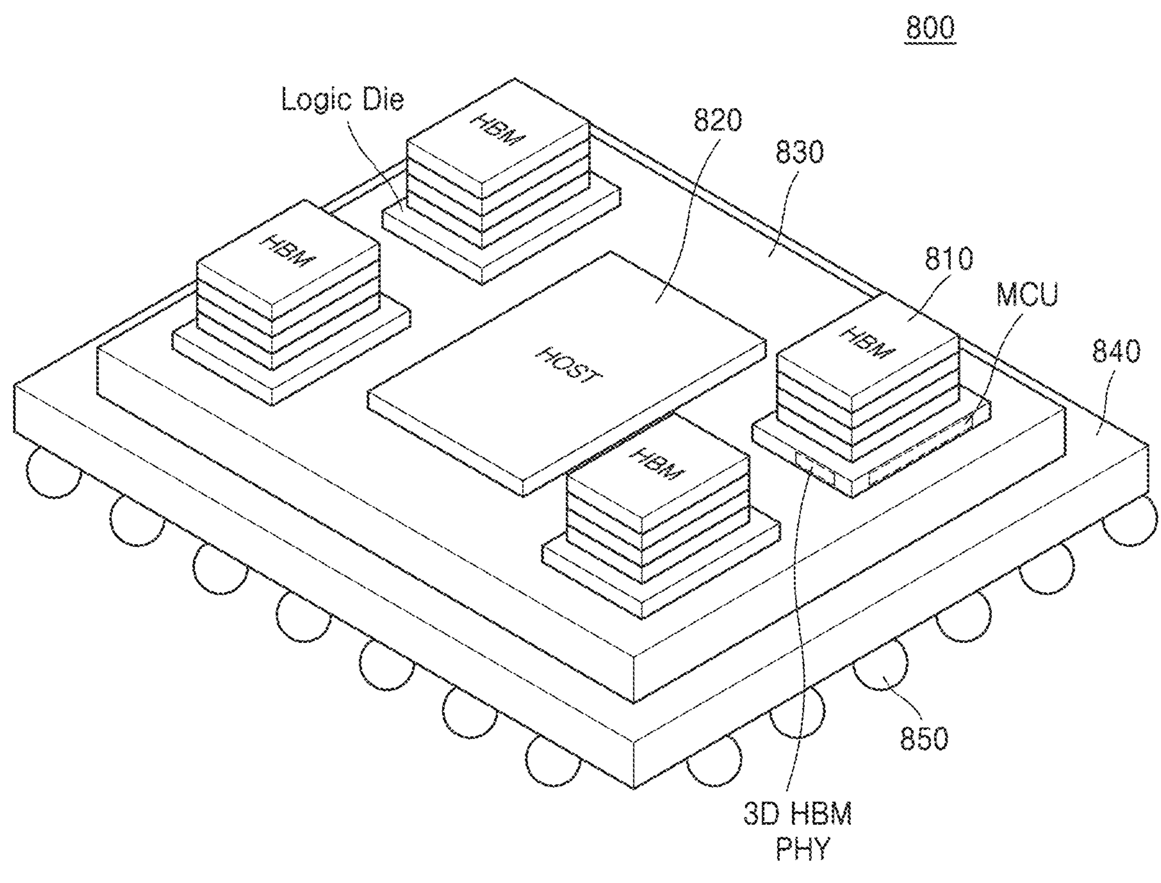
FIG. 14 is a diagram of an example of an electronic system including a semiconductor device according to some implementations.

FIG. 14 is a diagram of an example of an electronic system including a semiconductor device according to some implementations. In FIG. 14, an electronic system 800 may include one or more HBMs 810 and a host 820. The HBMs 810 and the host 820 may be mounted on an interposer 830, and the interposer 830, on which the HBMs 810 and the host 820 are mounted, may be mounted on a package substrate 840. The host 820 may correspond to various semiconductor devices requesting memory access.

The HBM 810 may be implemented as a semiconductor device according to some implementations described above, and accordingly, the HBM 810 may include a logic die and a plurality of core dies stacked on the logic die, according to some implementations, the logic die may include a memory control unit MCU, and may transmit signals having various phases to the core dies. On the other hand, when the HBM 810 includes a direct access (DA) region, a test signal may be provided into the HBM 810 via conductive means (for example, solder balls 850) mounted under the package substrate 840 and the DA region. The interposer 830 may be implemented in various forms, such as a silicon (TSV) form, an organic in a form of a PCB type, and an embedded multi-die interconnect bridge (EMIB) in a non-TSV method.

While this disclosure contains many specific implementation details, these should not be construed as limitations on the scope of what may be claimed, equivalents thereof, as well as claims to be described later. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A semiconductor device comprising:

at least one core die including a memory cell array; and a logic die configured to communicate with the at least one core die via a plurality of through silicon vias (TSVs), wherein the logic die comprises:

a memory controller configured to control a memory operation on the at least one core die;

first, second, third, and fourth TSV circuit blocks each configured to receive at least one of first, second, third, or fourth input signals, and generate at least one of first, second, third, or fourth output signals having different phases from each other and transmitted to the at least one core die via the TSVs; and a multi-phase clock generator configured to generate a first clock signal and a second clock signal having different phases from each other, provide the first clock signal to the first TSV circuit block and the third TSV circuit block, and provide the second clock signal to the second TSV circuit block and the fourth TSV circuit block, wherein the first TSV circuit block is configured to generate the first output signal in synchronization with the first clock signal, wherein the second TSV circuit block is configured to generate the second output signal in synchronization with the second clock signal, wherein the third TSV circuit block is configured to generate the third output signal in synchronization with an inverted first clock signal that is an inverted form of the first clock signal, and wherein the fourth TSV circuit block is configured to generate the fourth output signal in synchronization with an inverted second clock signal that is an inverted form of the second clock signal.

2. The semiconductor device of claim 1, wherein the first, second, third, and fourth input signals comprise bits of a command/address.

3. The semiconductor device of claim 1, wherein the first clock signal and the second clock signal have a phase difference of approximately 90 degrees from each other, and wherein the first, second, third, and fourth output signals have a phase difference of approximately 90 degrees from one another sequentially.

4. The semiconductor device of claim 3, wherein the first clock signal has a phase of approximately 0 degrees, and the second clock signal has a phase of approximately 90 degrees, and wherein the first clock signal and the second clock signal are configured to be provided to at least one of the first, second, third, or fourth TSV circuit blocks.

5. The semiconductor device of claim 1, wherein each of the first, second, third, and fourth TSV circuit blocks comprises:

a first clock input terminal configured to receive the first clock signal;

a second clock input terminal configured to receive at least one of the first clock signal or the second clock signal;

a selector configured to output, as an internal clock, at least one of a clock signal received via the second clock input terminal or an inverted clock signal of the received clock signal;

a first receiver configured to receive at least one of the first, second, third, or fourth input signal in synchronization with the first clock signal; and a second receiver connected to an output terminal of the first receiver, and configured to generate at least one of the first, second, third, or fourth output signal in synchronization with the internal clock.

6. The semiconductor device of claim 5, wherein the first TSV circuit block is configured to receive the first clock signal via the second clock input terminal and generate the first output signal having a phase of approximately 0 degrees in synchronization with the internal clock corresponding to the first clock signal, and wherein the second TSV circuit block is configured to receive the second clock signal via the second clock input terminal and generate the second output signal having a phase of approximately 90 degrees in synchronization with the internal clock corresponding to the second clock signal.

7. The semiconductor device of claim 6, wherein the third TSV circuit block is configured to receive the first clock signal via the second clock input terminal and generate the third output signal having a phase of approximately 180 degrees in synchronization with the internal clock corresponding to a first inverted clock signal that is an inverted form of the first clock signal, and wherein the fourth TSV circuit block is configured to receive the second clock signal via the second clock input terminal and generate the fourth output signal having a phase of approximately 270 degrees in synchronization with the internal clock corresponding to a clock signal that is an inverted form of the second clock signal.

8. The semiconductor device of claim 1, wherein the at least one core die comprises a plurality of core dies, and wherein the semiconductor device comprises a high bandwidth memory in which the plurality of core dies are vertically stacked on the logic die.

9. The semiconductor device of claim 1, wherein the logic die further comprises at least one of a central processing unit, a graphics processing unit, a neural processing unit, an accelerated processing unit, an application specific integrated circuit, or a universal chip interconnect express module.

10. A semiconductor device comprising:

at least one first die including a memory cell array; and a second die configured to communicate with the first die via a plurality of through silicon vias (TSVs), wherein the second die comprises:

a memory controller configured to control a memory operation on the first die; and a physical layer (PHY) region configured to:

receive from the memory controller, as an input signal, a command/address including a plurality of bits in relation with a control of the memory operation;

generate bits of the command/address having M phases based on first through $K^{th}$ clock signals having different phases from each other as an output signal; and transmit the output signal to the first die via the TSVs (K is an integer of 2 or more, and M is an integer greater than K).

11. The semiconductor device of claim 10, wherein the memory controller and the PHY region are configured to communicate with each other based on a double data rate PHY interface.

12. The semiconductor device of claim 10, wherein, in communicating with the first die via the TSVs, the PHY region comprises a level shifter configured to change voltage levels of the bits of the command/address.

13. The semiconductor device of claim 10, wherein the PHY region comprises first through $M^{th}$ TSV circuit blocks configured to generate the bits of the command/address having the M phases, and wherein each of the first through $M^{th}$ TSV circuit blocks correspond to processing of a signal input/output to/from a corresponding TSV.

14. The semiconductor device of claim 13, wherein the second die further comprises a multi-phase clock generator configured to generate first through $M^{th}$ clock signals corresponding to the M phases, and wherein the first through $K^{th}$ clock signals corresponding to some of the first through $M^{th}$ clock signals are distributed to the first through $M^{th}$ TSV circuit blocks.

15. The semiconductor device of claim 13, wherein the first through $M^{th}$ TSV circuit blocks comprise first, second, third, and fourth TSV circuit blocks configured to generate bits of the command/address having a 4-phase, and wherein the first clock signal is configured to be provided to the first TSV circuit block and the third TSV circuit block, and a second clock signal having a phase difference of approximately 90 degrees from the first clock signal is provided to the second TSV circuit block and the fourth TSV circuit block.

16. The semiconductor device of claim 15, wherein the first TSV circuit block is configured to generate the output signal in synchronization with the first clock signal, wherein the second TSV circuit block is configured to generate the output signal in synchronization with the second clock signal, wherein the third TSV circuit block is configured to generate the output signal in synchronization with a clock signal that is an inverted form of the first clock signal, and wherein the fourth TSV circuit block is configured to generate the output signal in synchronization with a clock signal that is an inverted form of the second clock signal.

17. The semiconductor device of claim 16, wherein the input signal is provided to the first, second, third, and fourth TSV circuit blocks in parallel, and wherein the first, second, third, and fourth TSV circuit blocks receive the input signal in synchronization with the first clock signal.

18. A memory controller comprising:

a memory control unit configured to control a memory operation on a memory device; and a physical layer (PHY) region configured to communicate with the memory device via a plurality of through silicon vias (TSVs), wherein the PHY region comprises:

a multi-phase clock generator configured to generate a first clock signal and a second clock signal having different phases from each other; and first through $M^{th}$ TSV circuit blocks, each configured to receive at least one of first through $M^{th}$ input signals from the memory control unit, and output, to the TSVs, at least one of first through $M^{th}$ output signals having different phases from each other by processing the first through $M^{th}$ input signals based on the first clock signal and the second clock signal (M is an integer of 3 or more), wherein the phases of the first through $M^{th}$ output signals comprise phases corresponding to the first clock signal and the second clock signal, and phases of inverted clock signals that are an inverted form of the first clock signal and the second clock signal.

19. The memory controller of claim 18, wherein the first clock signal and the second clock signal have a phase difference of approximately 90 degrees from each other, and the first through $M^{th}$ TSV circuit blocks comprise at least one of first, second, third, or fourth TSV circuit blocks configured to generate at least one of first, second, third, or fourth output signals sequentially having a phase difference of approximately 90 degrees, wherein the first TSV circuit block is configured to generate the first output signal in synchronization with the first clock signal, wherein the second TSV circuit block is configured to generate the second output signal in synchronization with the second clock signal, wherein the third TSV circuit block is configured to generate the third output signal in synchronization with a first inverted clock signal of the inverted clock signals that is an inverted form of the first clock signal, and wherein the fourth TSV circuit block is configured to generate the fourth output signal in synchronization with a second inverted clock signal of the inverted clock signals that is an inverted form of the second clock signal.

20. The memory controller of claim 19, wherein each of the first, second, third, and fourth TSV circuit blocks comprises a first clock input terminal configured to receive an input signal, and a second clock input terminal configured to receive a phase controlled output signal, wherein the first clock signal is provided to the first clock input terminals of the first, second, third, and fourth TSV circuit blocks, wherein the first clock signal is provided to the second clock input terminals of the first TSV circuit block and the third TSV circuit block, and wherein the second clock signal is provided to the second clock input terminals of the second TSV circuit block and the fourth TSV circuit block.

* * * * *